US009899459B2

(12) United States Patent
Lee et al.

(10) Patent No.: US 9,899,459 B2
(45) Date of Patent: Feb. 20, 2018

(54) ORGANIC LIGHT EMITTING DEVICE

(71) Applicant: LG Display Co., Ltd., Seoul (KR)

(72) Inventors: ARyoung Lee, Seoul (KR); KiSoub Yang, Paju-si (KR); HwangUn Seo, Paju-si (KR); YuRi Koh, Seoul (KR); Jihyun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/295,901

(22) Filed: Oct. 17, 2016

(65) Prior Publication Data
US 2017/0033167 A1 Feb. 2, 2017

Related U.S. Application Data

(62) Division of application No. 14/993,867, filed on Jan. 12, 2016, which is a division of application No.
(Continued)

(30) Foreign Application Priority Data

May 20, 2014 (KR) ........................ 10-2014-0060217

(51) Int. Cl.
*H01L 35/24* (2006.01)
*H01L 27/32* (2006.01)
(Continued)

(52) U.S. Cl.
CPC ....... *H01L 27/3246* (2013.01); *G09G 3/3258* (2013.01); *G09G 3/3266* (2013.01);
(Continued)

(58) Field of Classification Search
CPC ............ H01L 27/3246; H01L 51/5203; H01L 51/5206; H01L 51/5209
(Continued)

(56) References Cited

U.S. PATENT DOCUMENTS

2005/0285509 A1 12/2005 Funamoto et al.
2010/0200861 A1 8/2010 Lee et al.
(Continued)

FOREIGN PATENT DOCUMENTS

CN 1434669 A 8/2003
CN 1780017 A 5/2006
(Continued)

OTHER PUBLICATIONS

United States Office Action, U.S. Appl. No. 14/450,037, dated Jun. 26, 2015, 7 pages.
(Continued)

*Primary Examiner* — Matthew E Warren
(74) *Attorney, Agent, or Firm* — Fenwick & West LLP

(57) ABSTRACT

Disclosed is an organic light emitting device, (OLED) comprising a substrate on which a driving transistor is formed, a bank formed on the substrate providing a boundary for a pixel region, a first electrode formed on the substrate and electrically connected with the driving transistor, the first electrode comprising a first and second cross sectional area both oriented in a direction perpendicular to a vertical direction of the substrate, the first area adjacent to the bank, the second area surrounded by the first area, an organic layer formed on the first electrode within the boundary provided by the bank, and a second electrode formed on the organic layer, wherein during operation of the OLED a first electric field between the first area of the first electrode and the second electrode is greater than a second electric field between the second area of the first electrode and the second electrode.

7 Claims, 38 Drawing Sheets

Related U.S. Application Data

14/450,037, filed on Aug. 1, 2014, now Pat. No. 9,269,753.

(51) Int. Cl.
  *H01L 51/52* (2006.01)
  *H01L 27/12* (2006.01)
  *G09G 3/3258* (2016.01)
  *G09G 3/3266* (2016.01)
  *G09G 3/3291* (2016.01)

(52) U.S. Cl.
  CPC ....... *G09G 3/3291* (2013.01); *H01L 27/1251* (2013.01); *H01L 27/3248* (2013.01); *H01L 27/3258* (2013.01); *H01L 51/5203* (2013.01); *H01L 51/5206* (2013.01); *H01L 51/5209* (2013.01); *H01L 51/5215* (2013.01); *G09G 2300/0809* (2013.01); *G09G 2300/0842* (2013.01)

(58) Field of Classification Search
  USPC .............................. 257/40, 93, 99
  See application file for complete search history.

(56) References Cited

U.S. PATENT DOCUMENTS

| | | |
|---|---|---|
| 2010/0258833 A1 | 10/2010 | Okumoto et al. |
| 2013/0049028 A1 | 2/2013 | Kim et al. |
| 2013/0126851 A1 | 5/2013 | Nishiyama |
| 2014/0014913 A1 | 1/2014 | Lee |
| 2014/0217372 A1 | 8/2014 | Shim et al. |
| 2014/0239264 A1 | 8/2014 | Kwak et al. |
| 2015/0014634 A1* | 1/2015 | Kim .................. H01L 51/56 257/40 |

FOREIGN PATENT DOCUMENTS

| | | |
|---|---|---|
| CN | 102969329 A | 3/2013 |
| CN | 103219469 A | 7/2013 |
| JP | 2013206596 A | 10/2013 |

OTHER PUBLICATIONS

Chinese First Office Action, Chinese Application No. 201410599363.1, Jun. 7, 2017, 20 pages.

* cited by examiner

ORGANIC LIGHT EMITTING DEVICE

CROSS-REFERENCE TO RELATED APPLICATION

This application is a divisional of and claims priority to U.S. patent application Ser. No. 14/993,867, filed on Jan. 12, 2016 which is a divisional of and claims priority to U.S. patent application Ser. No. 14/450,037, filed on Aug. 1, 2014, which issued as U.S. Pat. No. 9,269,753 on Feb. 23, 2016, all of which claim priority from and the benefit under 35 U.S.C. §119(a) of Korean Patent Application No. 10-2014-0060217, filed on May 20, 2014, all of which are hereby incorporated by reference for all purposes as if fully set forth herein.

BACKGROUND

1. Field of Art

The present invention relates to an organic light emitting device and a method of fabricating the same.

2. Description of the Related Art

In the field of flat panel display, a liquid crystal display (LCD) of low power consumption has widely been used so far. However, because a liquid crystal display device is a non-emissive device which cannot emit the light in itself, there are many disadvantages in view the brightness, the contrast ratio viewing angle, a large area and the like.

The liquid crystal display displays an image by controlling light transmittance of a liquid crystal using an electric field. The liquid crystal display includes a liquid crystal panel in which liquid crystal cells are arranged in a matrix form and a driving circuit for driving thereof.

An organic light emitting device emits light using an electroluminescence phenomenon in which an organic compound placed between electrodes emits light when electric current flows between both electrodes. Further, an organic light emitting display device is a device for displaying an image by controlling an amount of electric current flowing to the organic compound so as to adjust an amount of emitted light.

The organic light emitting display device has an advantage in that it is possible to make it light and thin by emitting light using the thin organic compound between the electrodes.

However when the layer consisting of a device is formed by a soluble process, there is a problem in that a light emitting uniformity is degraded and light emitting efficiency is lowered.

SUMMARY

The present detailed description has been made to solve the above-mentioned problems in the conventional art, and an aspect of the present disclosure is to supply an organic light emitting device which prevents degradation of the light emitting uniformity and improves the light emitting efficiency.

In accordance with one embodiment, a display devices comprises an organic light emitting device (OLED) itself comprising a substrate on which a driving transistor is formed, a bank formed on the substrate providing a boundary for a pixel region, a first electrode formed on the substrate and electrically connected with the driving transistor, the first electrode comprising a first and second cross sectional area both oriented in a direction perpendicular to a vertical direction of the substrate, the first area adjacent to the bank, the second area surrounded by the first area, an organic layer formed on the first electrode within the boundary provided by the bank, and a second electrode formed on the organic layer, wherein during operation of the OLED a first electric field between the first area of the first electrode and the second electrode is greater than a second electric field between the second area of the first electrode and the second electrode.

As illustrated by this example embodiment, the various present embodiments can prevent degradation of the light emitting uniformity and improves light emitting efficiency in the organic light emitting device.

DETAILED DESCRIPTION OF THE EXEMPLARY EMBODIMENTS

Figure 1:
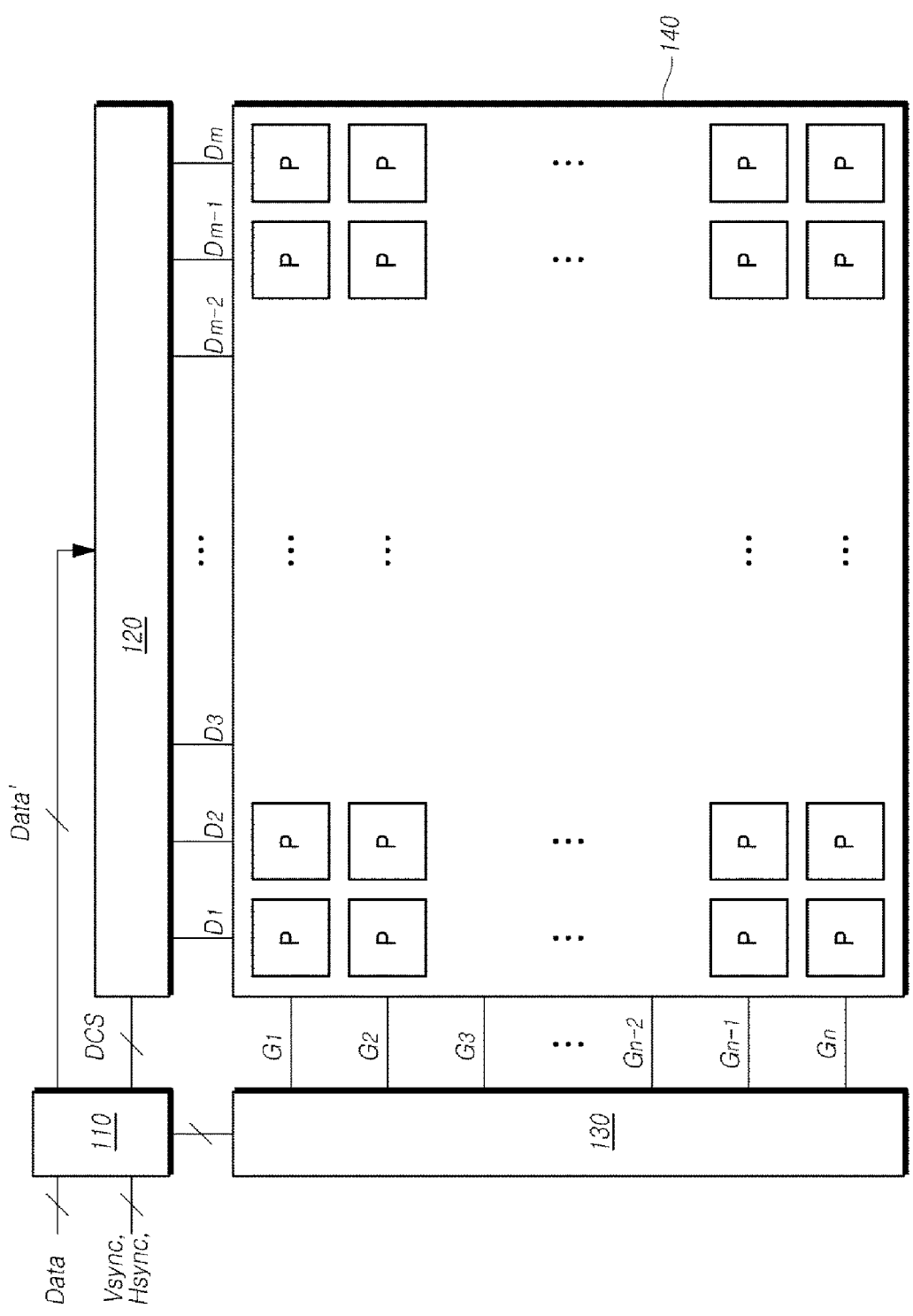
FIG. 1 is a view illustrating a system configuration of an organic light emitting display device to which exemplary embodiments are applied.

Hereinafter, a few embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order sequence or number of a corresponding component but used merely to distinguish the corresponding component from other component(s). It should be noted that if it is described in the specification that one component is "connected," "coupled" or "joined" to another component, a third component may be "connected," "coupled," and "joined" between the first and second components, although the first component may be directly connected, coupled or joined to the second component.

FIG. 1 is a view illustrating a system configuration of an organic light emitting display device to which exemplary embodiments are applied.

Referring to FIG. 1, the organic light emitting display device 100 may include a timing controller 110, a data driving unit 120, a gate driving unit 130 and an organic light emitting diode display panel 140.

The timing controller 110 rearranges digital video data RGB received from the external system 14 in conformity with a resolution of the liquid crystal display panel 16 and supplies the rearranged digital video data RGB to the data driving circuit 12. The timing controller 110 also generates a data control signal DCS for controlling the operation timing of the data driving circuit 120 and a gate control signal GCS for controlling operation timings of the gate driving circuit 130 by using a external timing signal such as a horizontal synchronization signal Hsync, a vertical synchronization signal Vsync, an image data RGB, a clock signal DCLK from an external system. The timing controller 110 can also convert the image data(data) from the external system into a data signal format capable of using the data driver 120 and supply the converted image data RGB' to the data driver 120.

The data driver 120 may convert the video data RGB into a data signal (an analog pixel signal or a data voltage), for example a voltage corresponding to a gray scale, in response to converted the video data(data') and the data control signal received from the timing controller 110, and supply it to data lines.

The gate driver 130 may supply a scan signal (a gate pulse, a scan pulse or a gate on signal) to a gate line in response to the gate control signal from the timing controller 110, and supply it to gate lines.

Each pixel on the display panel 140 is defined at each of intersection regions in a matrix form on a first substrate, at which plural data lines D 1 to Dn extending in one direction intersect with plural gate lines G1 to Gn extending in the other direction. Each pixel on the display panel 140 may be at least one organic light emitting device including an anode as a first electrode, a cathode as a second electrode, and an organic light emitting layer.

Figure 2:
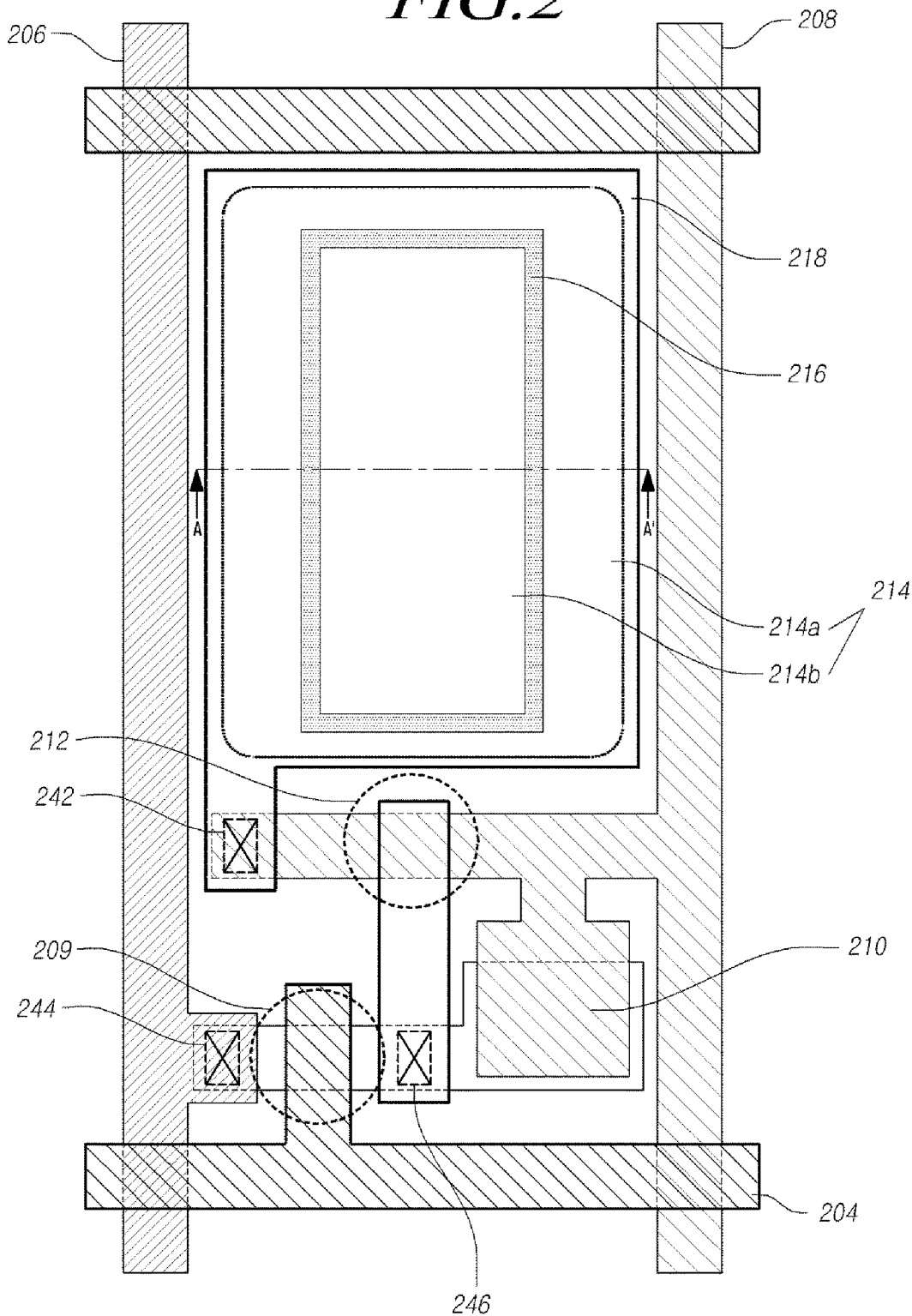
FIG. 2 is a planar view schematically illustrating an organic light emitting device according to one embodiment.

FIG. 2 is a planar view schematically illustrating an organic light emitting device according to one embodiment.

Referring to FIG. 2, an organic light emitting device 200 may include the substrate 202 formed on an driving transistor 212, a bank or a pixel defining layer 218 which is formed on the substrate 202 and defines the boundary of a pixel region, a first electrode 214 formed on the substrate 202 and electrically connected with the driving transistor 212 wherein the quantity of a current flowing through a first area 114a adjacent to the bank is larger than that through a second area 214b, an organic layer (not shown) formed on the substrate 202 corresponding to the pixel region and a second electrode (not shown) formed on the organic layer.

An edge of the first electrode 214 is partially overlapped with the bank 218.

The first area 214a in the first electrode 214 consists of a monolayer comprising one of ITO (Indium tin oxide), FTO (Fluorine-doped Tin Oxide), ATO (Antimony Tin Oxide), AZO (Aluminum doped Zinc Oxide) and IZO (Indium Zinc Oxide) or a multilayer comprising two or more of the ITO, the FTO, the ATO, the AZO and the IZO. In case the first area 214a consists of the multilayer, the first insulating layer 216 is further comprised of at least a step porting between the first electrode and the organic layer.

The organic light emitting device 200 may comprise a plurality of electric lines. The plurality of electric lines comprise a scan line extending in one direction, namely vertical direction in FIG. 2, and transmitting a scan signal or a gate signal respectively, a data line extending in the other direction, namely horizontal direction in FIG. 2 and transmitting a data signal respectively, and a power line (hereafter, is referred as a "VDD line") supplying a high voltage power. The VDD line is separated with the scan line in parallel. The scan line is extended to a gate pad (not shown) in the vertical direction and the data line is extended to a data pad (now shown) in the horizontal direction in FIG. 2.

The data line 206 and the VDD line 208 may be formed with a monolayer or multiple layers of at least one metal or alloy of Al, Pt, Pd, Ag, Mg, Au, Ni, Nd, Ir, Cr, Li, Ca, Mo, Ti, W and Cu, ALND, MoTi and the like.

The organic light emitting device 200 may include the electrodes 214 and the organic layer at a pixel area which is defined at each of intersection between the scan line 204 and the data line 206, and emit a light in accordance with a current supplied from the transistors 209 and 212 formed on the substrate 202.

The first electrode 214 is connected to one end of the driving transistor 212 through a first contact hole 242, the other end of the driving transistor 212 is connected to the VDD line 208, and the VDD line 208 is connected to a storage capacitor 210. The storage capacitor 210 is connected to one end of a switching transistor 209 through a third contact hole 246 and the other end of the switching transistor 209 is connected to the data line 206 through a second contact hole 244. The scan line 204 is connected to a gate of the switching transistor 209.

In view of electrical function of the organic light emitting device 200, the switching transistor 209 is turned on by the scan signal supplied through the scan line 204 so that the data signal supplied through the data line 206 is transmitted to the gate electrode of the driving transistor 212. The storage capacitor 210 may store the data signal supplied through the switching transistor 209 and maintain the turn-on state during the predetermined time. The driving transistor 212 is driven in response to the data signal stored to the storage capacitor 210. The driving transistor 212 may control the driving current or voltage supplied to the first electrode 214 in response to the data signal.

If the driving transistor is driven, an emitting layer of the organic layer may emit the light by the current supplied through the VDD line. When the driving current supplied through the driving transistor 212 is transmitted to the first electrode 214 and flows through the organic layer to the second electrode, an electron and a hole is recombined in the organic layer so as to emit the light.

Hereafter, the structure of the organic light emitting device 200 will be described in reference with the section taken along a line A-A' according to various embodiments.

The organic light emitting device includes an organic layer, which in many cases is curved in a concave shape. Often, this is due to the process of generating the organic light emitting device. A consequence of this curvature is that the luminosity of the organic light emitting device varies due to varying thickness of the organic layer as a result of the curvature. More specifically, the varying thickness affects the electric field between the first and second electrodes on either side of the organic layer, causing the device to brighter where the organic layer is thicker and dimmer where the organic layer is thinner.

The organic light emitting device is structured so as to counteract this difference in electric field. This may be accomplished in a number of different ways, depending upon the implementation. Generally, this is accomplished by making the electric field comparatively larger near the first area of the first electrode, and/or by making the electric field comparatively smaller near the second area of the first electrode. This may also be stated in terms of quantities other than electric field. For example, the quantity of a current flowing through a first area adjacent to the bank may be made larger than that through a second area, and/or the quantity of a voltage at the first area may be made larger than that at a second.

Different implementations may use different constructions of the organic light emitting device to achieve this goal. In one embodiment, the thickness of the first area of the first electrode adjacent to a bank is higher in a direction perpendicular to a vertical direction of the substrate than that of the second area of the first electrode not adjacent to the bank so that the electric field of the former area is larger than that of the latter. Here, the area adjacent to a bank in the first electrode consists of a monolayer or a multilayer.

In another embodiment, the first and second areas of the first electrode are created using different materials that have different specific resistances. In another embodiment, the first and second areas of the first electrode are physically separated and are powered by different driving transistors having different current drivability.

To even out the electric field across the surface of the organic layer, insulating layers may be strategically placed at the boundaries between, or simply between, the first and second areas of the first electrode.

Figure 3:
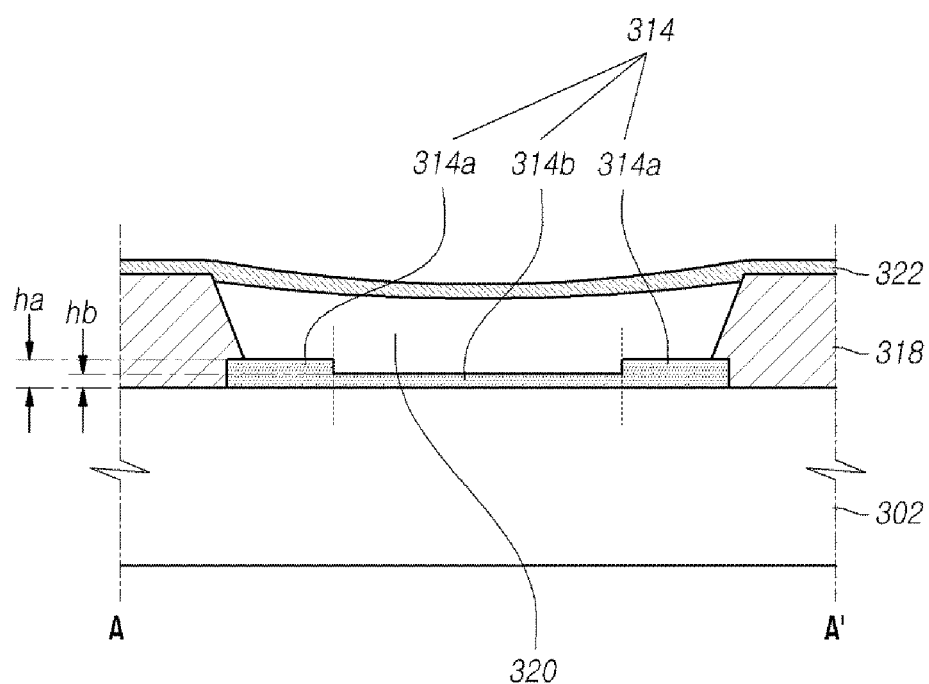
FIG. 3 is a sectional view illustrating one example of an organic light emitting device, which is taken alone a line A-A' in FIG. 2, according to one embodiment.

FIG. 3 is a sectional view illustrating one example of an organic light emitting device, which is taken alone a line A-A' in FIG. 2, according to one embodiment.

Referring to FIGS. 2 and 3, a first electrode 314 is formed on a first substrate 302 on which the driving transistor 212, and there is formed a bank 318 which defines the pixel region. An edge of the first electrode 314 is partially overlapped with the bank 318. The first electrode 314 is exposed through the open region of the bank 318 and an organic layer 320 is formed on the first electrode 314. The second electrode 322 is formed in order to cover the bank 318 and the organic layer 320.

The first substrate 302 may be a plastic substrate including polyethylene terephthalate (PET), polyethylene naphthalate (PEN), and polyimide as well as a glass substrate. Further, the first substrate 302 may further include a buffer layer for isolating penetration of impure element, which is formed thereon. The buffer layer may be formed of, for example, a monolayer or multiple layers of silicon nitride or silicon oxide. Although not shown in FIG. 3, the first substrate 302 may include the transistors 209 and 212 including a gate electrode, source/drain electrodes, a gate insulating layer, an active layer and the like. The driving transistor 212 is electrically connected to the first electrode 314.

The first electrode 302 may be either a anode or cathode. The first electrode 302 may be formed of, by a deposition or a liquid state process, a transparent conductive material having a relatively large work function and playing a role of an anode electrode (positive electrode), for example, a metal oxide such as ITO (Indium tin oxide), FTO (Fluorine-doped Tin Oxide), ATO (Antimony Tin Oxide), AZO (Aluminum doped Zinc Oxide) and IZO (Indium Zinc Oxide): Al or SnO2: Sb, and conductive polymer such as poly (3-methyl-thiophene), poly [3,4-(ethylene-1,2-di oxy) thiophene] (PEDT), polypyrrole, polyaniline, etc., but is not limited thereto. Further, the first electrode 302 may formed of, by a soluble process, a carbon nanotube, graphene, a silver nanowire and the like. The first electrode 302 is formed with a metal oxide by either using a soluble process in which the nanowires is dispersed in the solvent phase of a mesh-type, or using a transparent multilayer electrode of dielectric/metal/dielectric structure so at to produce a transparent electrode. In the case of the top emission, a reflection plate made of a metal material with excellent reflection efficiency, for example, aluminum (Al) or silver (Ag), may be further formed as an auxiliary electrode on upper and lower portions of the first electrode 302 in order to improve the reflection efficiency.

In the first electrode 302 of the organic light emitting device 200 according to one embodiment the thickness $h_a$ of the first area 314a adjacent to the bank 318 is larger than that $h_b$ of the second area not adjacent to the bank 318 ($h_a > h_b$). In other words, because the electrical resistance value is inversely proportional to the cross-sectional area of the first electrode 302 through which the electric current flows, the electrical resistance value of the first area 314a is smaller than that of the second area 314b. Therefore, when the switching transistor 209 is turned on, the quantity of the current flowing to the first area 314a may become larger than that of the second area 314b.

There may exist a step porting between the first electrode 314 and the organic layer 320. In this case, a first insulating layer may be formed at least a step porting between the first electrode and the organic layer, but is not limited thereto.

The method for fabricating the first electrode 302 with the different thicknesses will be described below in reference with FIGS. 7 and 8.

There may be the bank 318 defining the pixel region and in shape of eclipse, namely oval. The opening is comprised in the bank 318 so that the first electrode 314 is exposed and an edge portion of the bank 318 is overlapped with an edge portion of the first electrode 314.

Generally, the bank 318 has an unsmooth surface on which various wires and transistors are arranged, and is used to prevent the organic material from being deteriorated when an organic layer is formed on the surface of the bank 318 which has unevenly formed steps.

The bank 318 may be formed of an inorganic insulation material such as silicon nitride (SiNx) and silicon oxide (SiOx), an organic insulation material such as benzocyclobutene or acrylic resin, or a combination thereof, but is not limited thereto.

The bank 318 may be formed in a forward tapered shape, which enables the organic layer 320 and the second electrode 322 to be formed without a step because of the forward tapered shape of the bank 318. When the organic layer 320 and the second electrode 322 is formed without a step, it can improve a step coverage.

The organic layer 320 is formed inside a boundary of the bank 318 on the first electrode 314. The organic layer 320 may include, not limited thereto, a hole injection layer (HIL), a hole transfer layer (HTL), an emitting supplemental layer, an emitting layer (EML), an electron transfer layer (ETL), an electron injection layer (EIL), and the like which are sequentially laminated so that a hole and an electron are smoothly transferred to form an exciton.

The organic layer 320 according to one embodiment may be formed by a soluble process such as a inkjet printing, a roll to roll printing, a screen printing, a spray coating, a dip spin coating, a blade coating, a roll-slit coating and the like, but not limited thereto, a chemical vapor deposition, a physical vapor deposition and the like.

In more detail, the organic layer may comprise at least one of the hole injection layer (HIL), the hole transfer layer (HTL), the emitting supplemental layer, the emitting layer (EML), the electron transfer layer (ETL), the electron injection layer (EIL), and one of the hole injection layer, the hole transport layer, the emitting supplemental layer, the emitting layer, the electron transport layer and the electron injection layer is formed by the soluble process. Specifically the hole injection layer (HIL), the hole transport layer (HTL) and the emitting layer (EML) are formed by the soluble process.

However when the layer consisting of a device is formed by a soluble process, an upper surface of the organic layer 320 may be formed in curved surface as shown in FIG. 3. That is, a thickness of the organic layer 320 in the first area 314a is larger than a thickness thereof in the second area 314b, namely a central area of the organic layer 320. When the first electrode 314 is formed as a flat surface, the injection of the hole from the first electrode 314 to the thick area of the organic layer 320 is not so good that a light emitting uniformity can be degraded and light emitting efficiency be lowered. In the first electrode 302 of the organic light emitting device 200 according to one embodiment the thickness $h_a$ of the first area 314a is larger than that $h_b$ of the second area 314b. as a result, the electrical resistance value of the first area 314a is smaller than that of the second area 314b. Therefore, when the organic light emitting device is turned on, the quantity of the current flowing to the first area 314a may become larger than that of the second area 314b, thereby maintaining the light emitting uniformity.

The second electrode 322 is formed at entire surface of the substrate 302 on the organic layer 320. The second electrode 322 may be either an anode or a cathode. In the case of the bottom emission, for example, the second electrode 337 may be formed of a metal with a monolayer or multiple layers of an alloy in which a first metal, e.g., silver (Ag), and a second metal, e.g., magnesium (Mg), are mixed in a desired proportion. The second electrode 322 may be formed by the soluble process using a solution including an organic metal ink or a nano ink such as Ag, Al, Au, Ni and the like.

Figure 4:
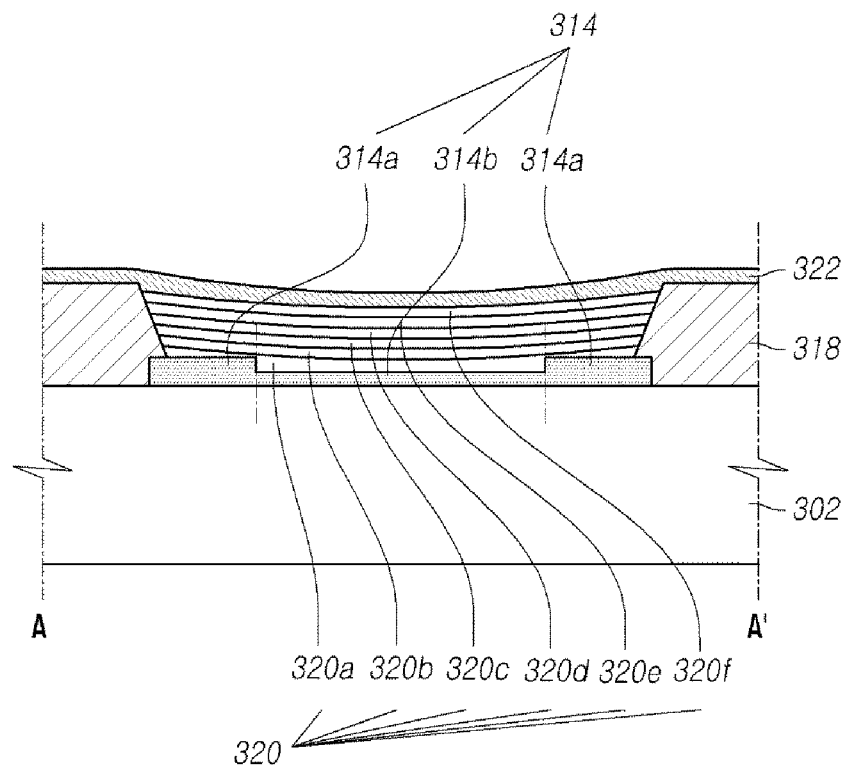
FIG. 4 is a sectional view illustrating other example of an organic light emitting device, which is taken alone a line A-A' in FIG. 2, according to one embodiment.

FIG. 4 is a sectional view illustrating other example of an organic light emitting device, which is taken alone a line A-A' in FIG. 2, according to one embodiment.

Referring to FIG. 4, the organic layer may comprise the hole injection layer 320a, the hole transfer layer 320b, the emitting supplemental layer 320c, the emitting layer 320d, the electron transfer layer 320e, the electron injection layer 320f.

The organic layer may be formed by material for the soluble process. For example, the hole injection layer 320a, the hole transport layer 320b and the emitting layer 320d may be formed by material for the soluble process. In this specification, the material for the soluble process may means material used for forming one layer of the organic light emitting device 200 by the soluble process.

In detail, the hole injection layer 320a is formed by the material for the soluble process such as PEDOT:PSS (Poly (3,4-ethylenedioxythiophene)-poly(styrenesulfonate)), S-P3MEET (sulfonated Poly(thiophene-3-[2-(2-methoxyethoxy)ethoxy]-2,5-diyl)), PVPTA2:TBPAH

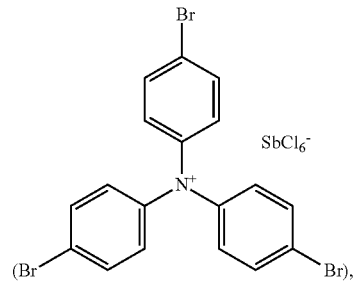

Et-

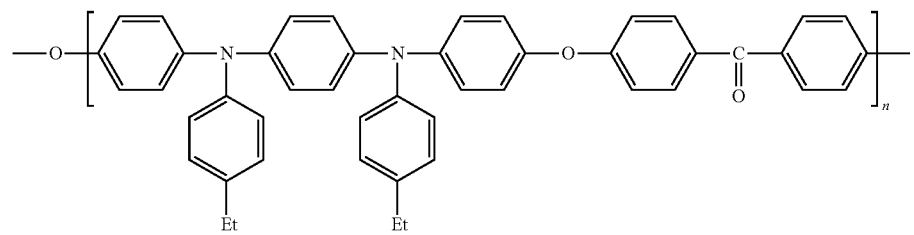

PTPDEK

and the like, but is not limited thereto.

the hole transport layer 320b is formed by the material for the soluble process such as TFP(Poly(2,7-(9,9-di-n-octyl-fluorene)-alt-(1,4-phenylene-((4-sec-butylphenyl)imino)-1, 4-phenylene)), PFO-TPA
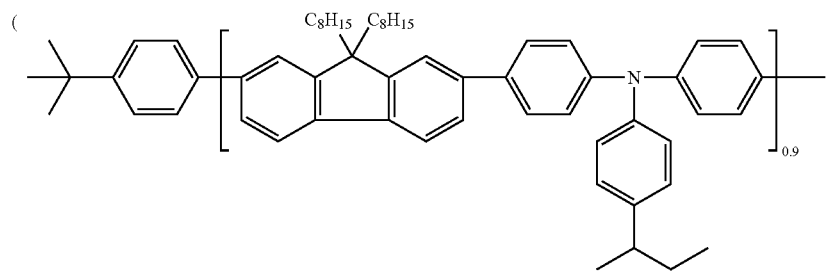
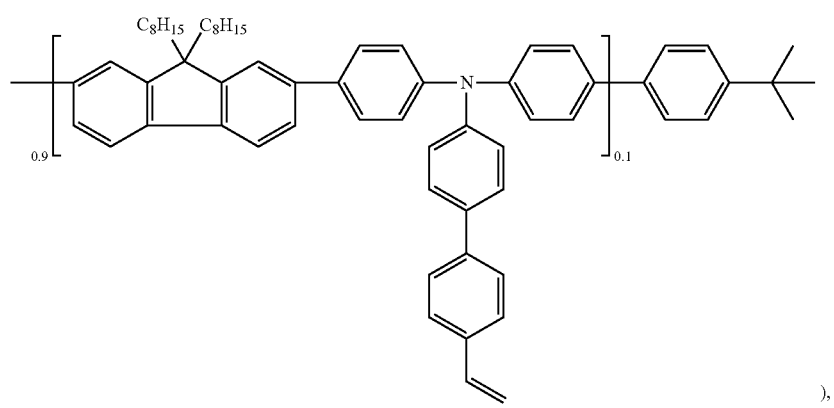
TCTA(4,4',4''-Tris(N-carbazolyl)-triphenylamine), TAPC(1, 1-Bis(4-(N,N'-di(p-tolyl)amino)phenyl)cyclohexane), d-PBAB
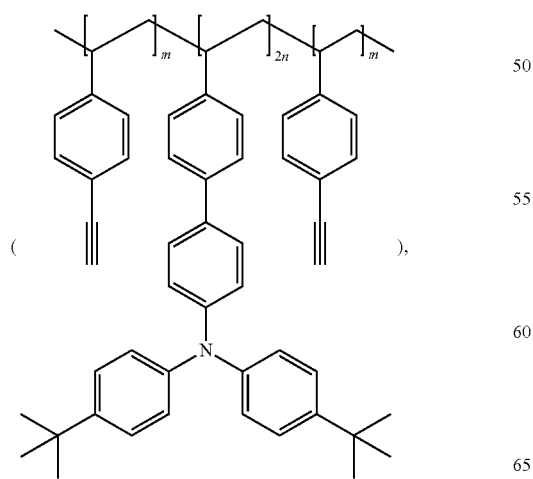

x-TAPC

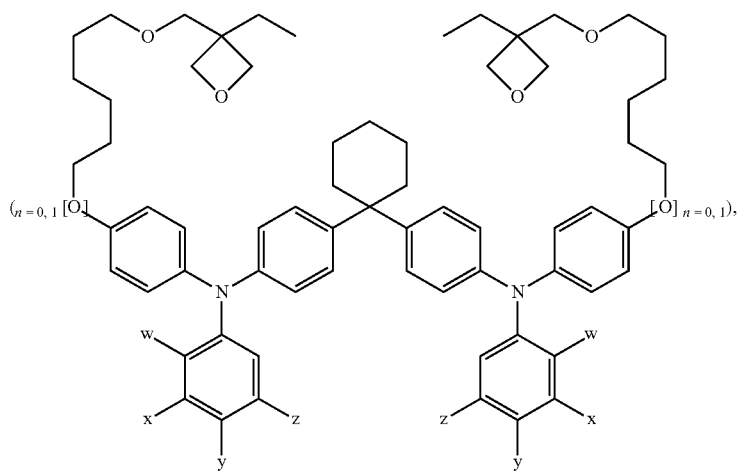

x-TAPC

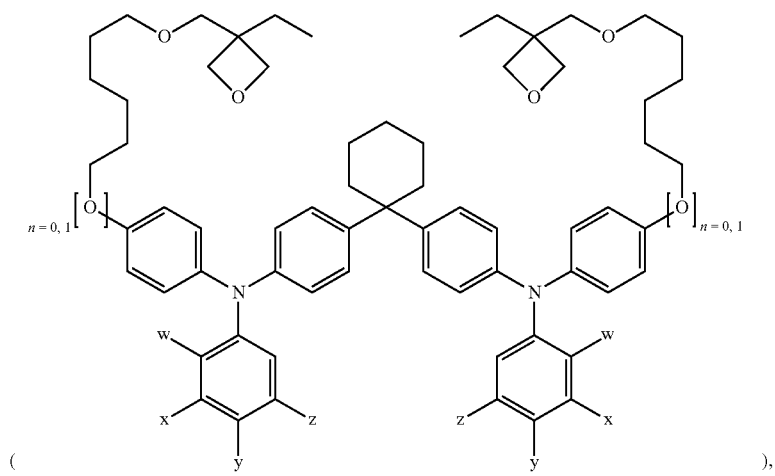

a-NPD(N,N'-diphenyl-N,N'-bis(1-naphthyl)-1,1'biphenyl-4,4'-diamine), TPD(N,N'-Bis-(3-methylphenyl)-N,N'-Bisphenyl(1,1'-biphenyl)-4,4'-diamine) and the like, but is not limited thereto.

Further the emitting layer 320d may be formed by the material for the soluble process such as combination of iridium-based complex compound as a dopant and a bipolar aromatic compound/polymer as a host, or one of PPV(poly(p-phenylenevinylene)), PThs(poly(thiophene)s), Cyano-PPV, PPP(poly(p-phenylene)), poly(fluorene)s, PFO(polyfluorene), PF(polyfluorene), PVK(poly(9-vinylcarbazole) and the like, but is not limited thereto.

The electron transfer layer 320e may be formed by the material for the soluble process such as TPBI(1,3,5-Tris(1-phenyl-1H-benzimidazol-2-yl)benzene),

TBCPF

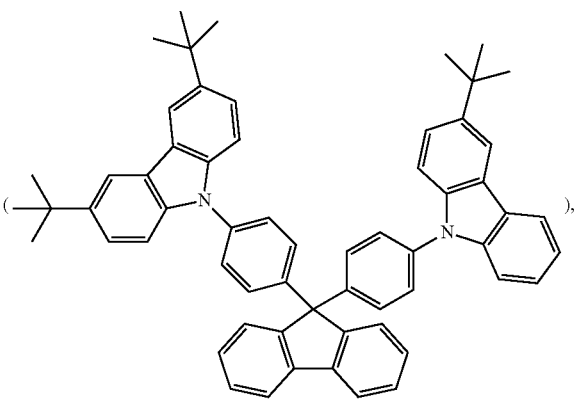 [SMILES: CC(C)(C)c1ccc2c(c1)c1ccccc1n2-c1ccc(C2(c3ccc(-n4c5ccc(C(C)(C)C)cc5c5cc(C(C)(C)C)ccc54)cc3)c3ccccc3-c3ccccc32)cc1]

BA

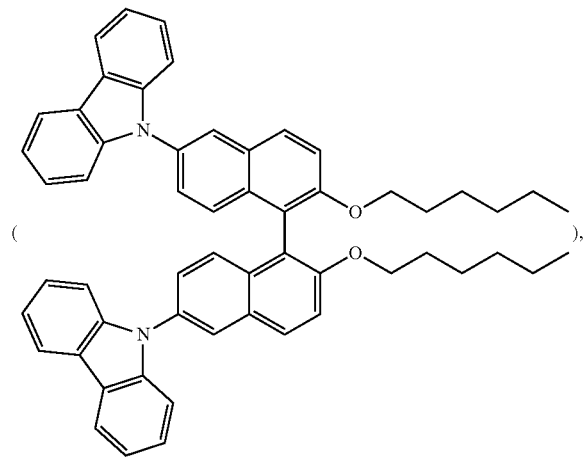 [SMILES: CCCCCCOc1ccc2cc(-n3c4ccccc4c4ccccc43)ccc2c1-c1c(OCCCCCC)ccc2cc(-n3c4ccccc4c4ccccc43)ccc12]

m-PhOTPBI

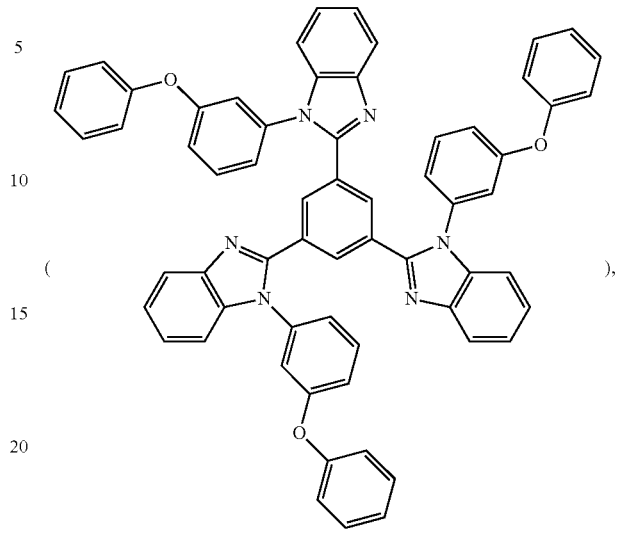

PFN-OH

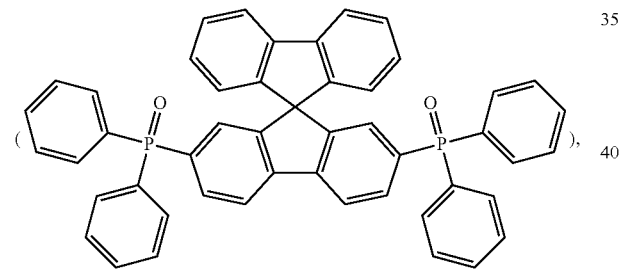

SPPO13 mCPPO1

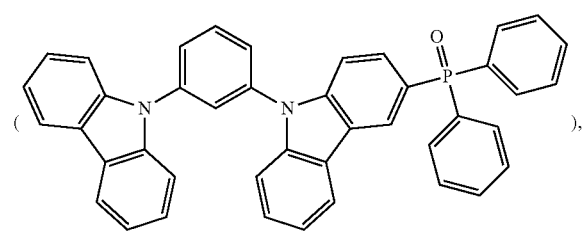 [SMILES: O=P(c1ccccc1)(c1ccccc1)c1ccc2c(c1)c1ccccc1n2-c1cccc(-n2c3ccccc3c3ccccc32)c1]

and the like, but is not limited thereto.

Figure 5:
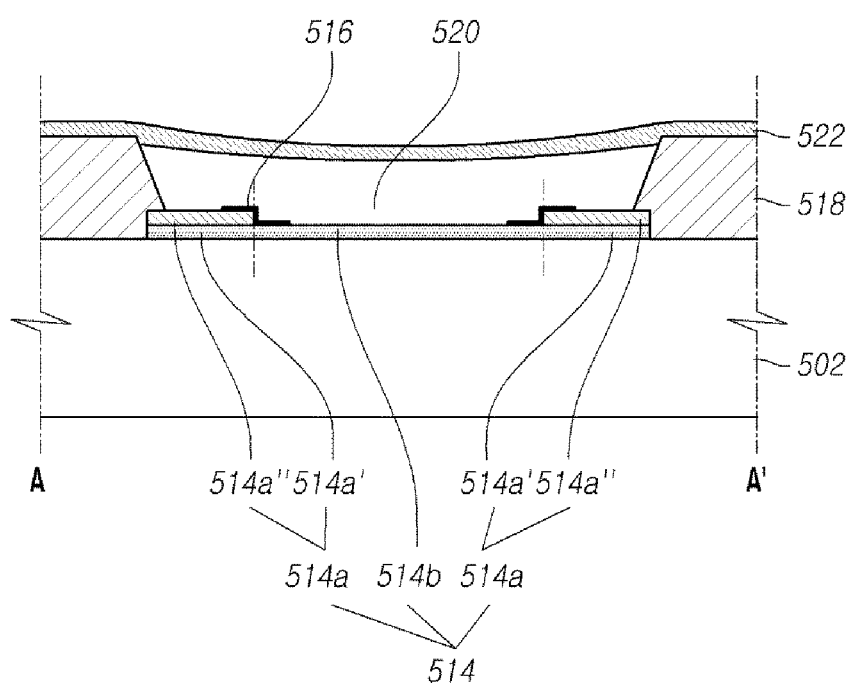
FIG. 5 is a sectional view illustrating another example of an organic light emitting device, which is taken alone a line A-A' in FIG. 2, according to one embodiment.

FIG. 5 is a sectional view illustrating another example of an organic light emitting device, which is taken alone a line A-A' in FIG. 2, according to one embodiment.

Referring to FIG. 5, there is formed a bank 518 which defines the pixel region. The first electrode 514 is formed on the substrate 502. An edge of the first electrode 514 is partially overlapped with the bank 518. The first electrode 514 is electrically connected to the driving transistor. The quantity of the current flowing to the first area 514a adjacent to the bank 518 may become larger than that of the second area 514b.

The first electrode 514 may be a multilayer including two or more of ITO (Indium tin oxide), FTO (Fluorine-doped Tin Oxide), ATO (Antimony Tin Oxide), AZO (Aluminum doped Zinc Oxide) and IZO (Indium Zinc Oxide): Al or $SnO_2$: Sb, and conductive polymer such as poly (3-methyl-thiophene), poly [3,4-(ethylene-1,2-di oxy) thiophene] (PEDT), polypyrrole, polyaniline, etc. In this case, the first insulating layer 516 may be formed at a step portion between the first electrode 514 and the organic layer 520.

The first electrode 514 is divided into the first area 514a adjacent to the bank 518 and the second area 514b, namely a central area thereof. The first area 514a may consist of two layers. The first area 514a is divided into a lower layer 514a' and an upper layer 514a" each of which consists of at least one of ITO, FTO, ATO, AZO, IZO and the like. The lower layer 514a' and the upper layer 514a" may be either a monolayer with the same material or a dual layer with different materials. The first area 514b may have also two or more layers.

Meanwhile the first insulating layer 516 may be formed of an inorganic insulation material such as silicon nitride (SiNx) and silicon oxide (SiOx), SiON, Al2O3, TiO2, Ta2O5, HfO2, ZrO2, BST, PZT, an organic insulation material such as benzocyclobutene or acrylic resin, or a combination thereof, but is not limited thereto. The first insulating layer 516 may be formed at a step portion of the first area 514a of the first electrode 514, thereby preventing the degradation by a concentration of a charge, and a leakage current when the organic light emitting device 200 is turned on.

The organic layer 520 may be formed on the first electrode 514 in order to cover the first insulating layer 516. The second electrode 5322 may be formed on the organic layer 520 in order to cover the bank 518 and the organic layer 520.

Figure 6:
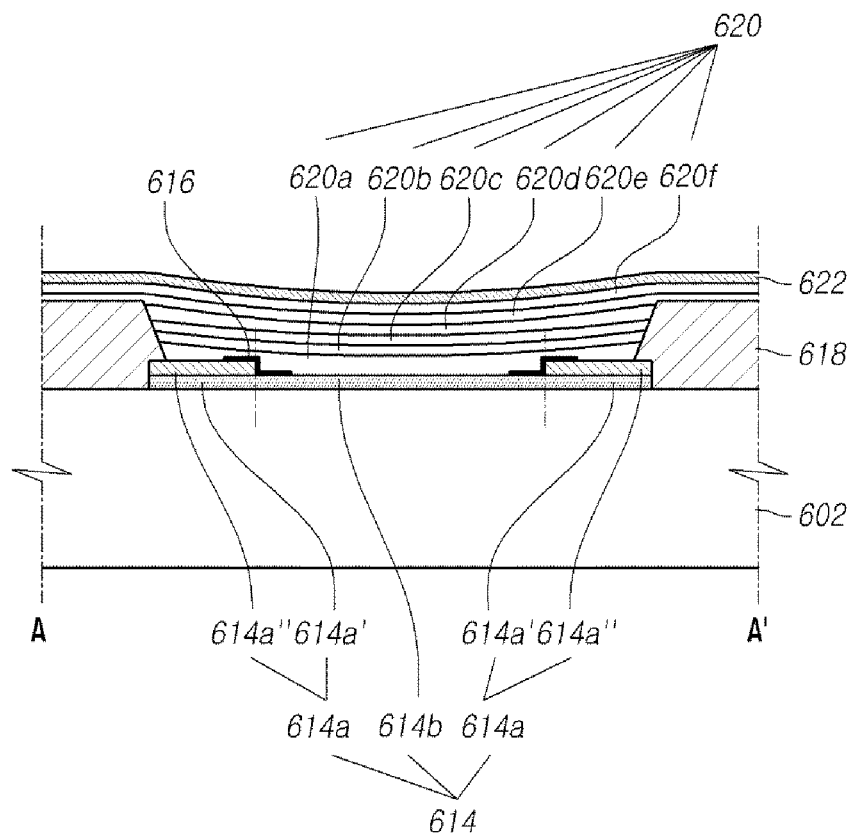
FIG. 6 is a sectional view illustrating further another example of an organic light emitting device, which is taken alone a line A-A' in FIG. 2, according to one embodiment.

FIG. 6 is a sectional view illustrating further another example of an organic light emitting device, which is taken alone a line A-A' in FIG. 2, according to one embodiment.

Referring to FIG. 6, there is formed a bank 518 which defines the pixel region. The first electrode 514 is formed on the substrate 602. An edge of the first electrode 614 is partially overlapped with the bank 618. The first electrode 614 is electrically connected to the driving transistor. The quantity of the current flowing to the first area 614a adjacent to the bank 618 may become larger than that of the second area 614b.

The first electrode 614 may be a multilayer. In this case, the first insulating layer 616 may be formed at a step portion between the most upper layer of the first electrode 514 and the organic layer 520. The second area 614b not adjacent to the bank 618 may be a monolayer.

The hole injection layer 620a, the hole transfer layer 620b, the emitting supplemental layer 620c, the emitting layer 620d of the organic layer 620 is formed inside a opening portion of the bank 618 on the first electrode 614. And the electron transfer layer 620e and the electron injection layer 620f may be formed in order to cover the bank 618 and the emitting layer 620d.

The organic layer 620 may be formed by the material for the soluble process, thereby beneficially reducing the number of the processes according to the large area of the display panel and the cost of equipment.

The method for fabricating the first electrodes 314, 514 and 614 of the organic light emitting device 200 will be described below.

FIGS. 7A to 7G are sectional views illustrating the method for fabricating the organic light device in FIG. 3 according to the other embodiment.

Referring to FIGS. 7A to 7G, the first electrode 314 may be formed by a patterning process for patterning material 730 for a photoresist layer using a halftone mask or a slit mask 732, an ashing process and an etching process.

Figure 7A:
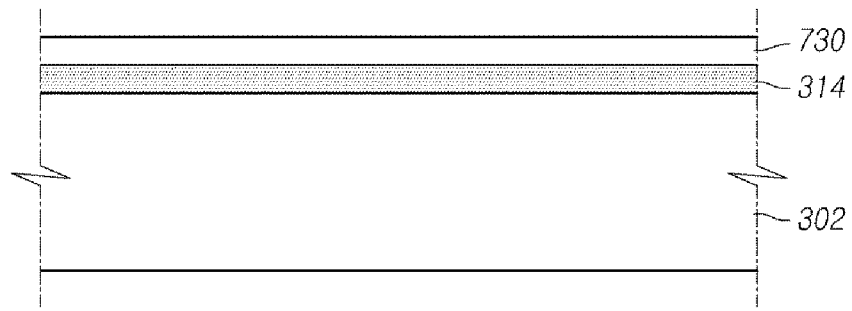
FIGS. 7A to 7G are sectional views illustrating the method for fabricating the organic light device in FIG. 3 according to the other embodiment.

Referring to FIG. 7A, material for the first electrode 314 is formed on the substrate 302. The photoresist layer 730 is formed by coating material for the photoresist on the first electrode 314. The material for the first electrode 314 may be one of ITO, ATO, AZO, ZTO, IZO and the like.

The above process is performed by the soluble process such as a spin coating, a roll to toll process, a screen printing and the like, a chemical vapor deposition, a physical vapor deposition and the like, but is not limited thereto.

Figure 7B:
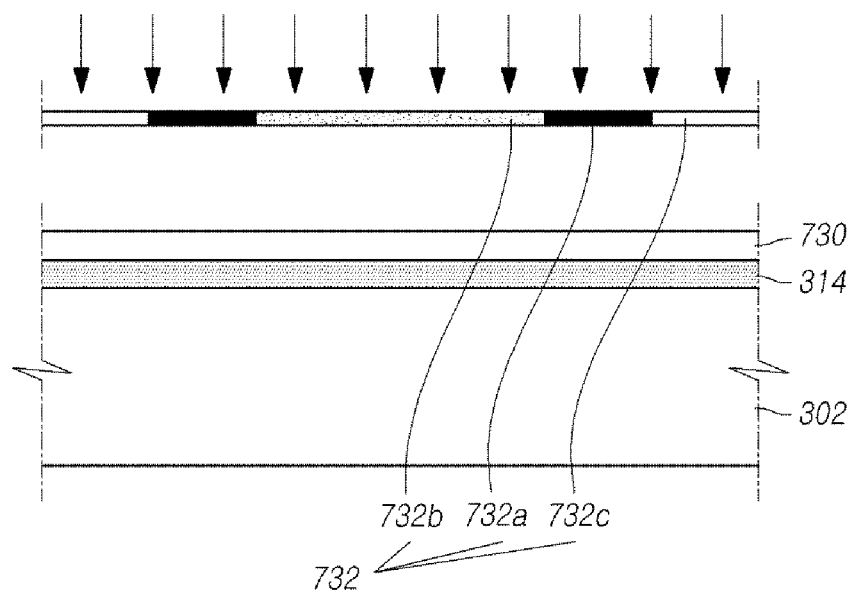

Referring to FIG. 7B, the halftone mask 732 includes a light shield area, a light semi-transmission area and a transparent area. The material for the photoresist layer 730 is patterned by not only a positive photoresist material in which an area of the photoresist layer transparent to the light is deleted but also a negative photoresist material.

The halftone mask is aligned to the precise aligned position and then there is performed the exposure process in which light is emitted from the light source to the halftone mask 732 and a pattern of the halftone mask 732 is transferred to the substrate. The material for the photoresist layer 730 exposed is decomposed and patterned by performing a developing or an etching process.

Figure 7C:
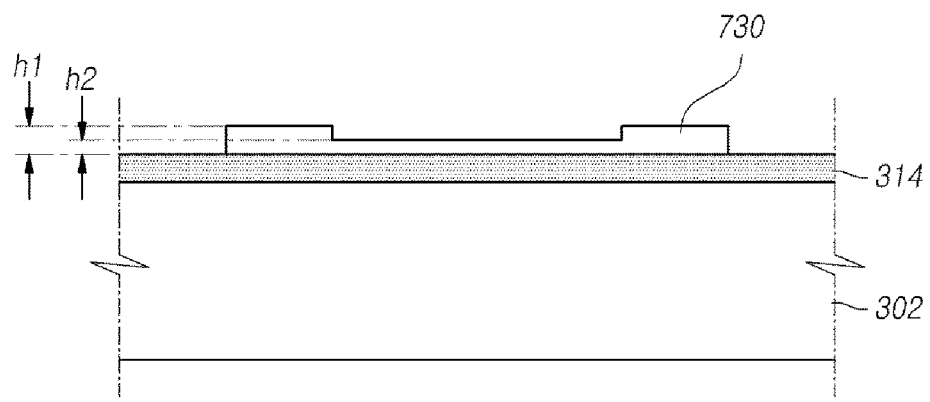
Figure 7D:
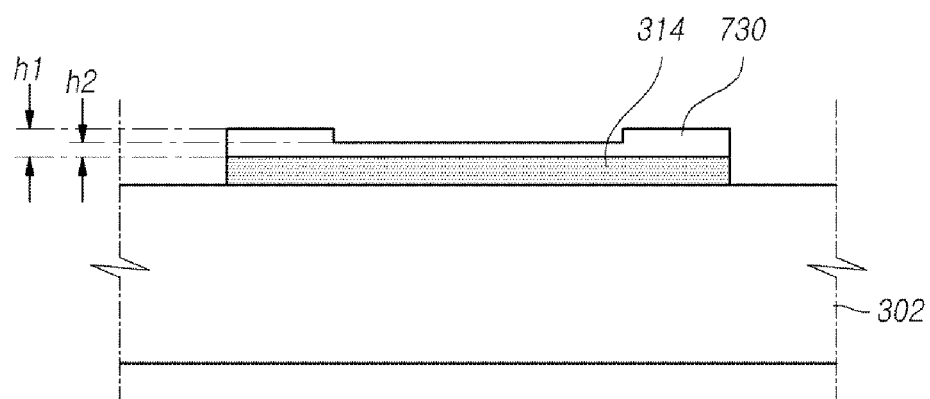

Referring to FIGS. 7C and 7D, as a result of the patterning, an area of the material for the photoresist layer 730 corresponding to the transparent area 732c of the halftone mask 732 is completely deleted, an area of the material for the photoresist layer 730 corresponding to the semitransmission area 732b of the halftone mask 732 has the height of $h_2$ and an area of the photoresist layer 730 corresponding to the light shield area 732a of the halftone mask 732 has the height of $h_1$ ($h_1 > h_2$).

Next, the first electrode 314 not covered with the material for the photoresist layer 730 is deleted through a wet etching or a dry etching process.

Figure 7E:
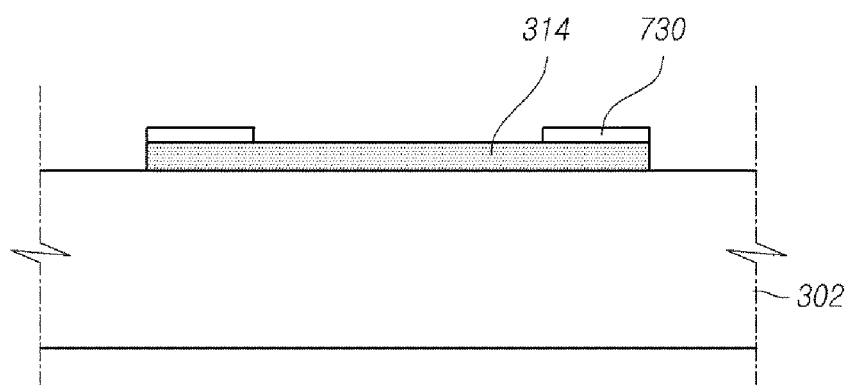
Figure 7F:
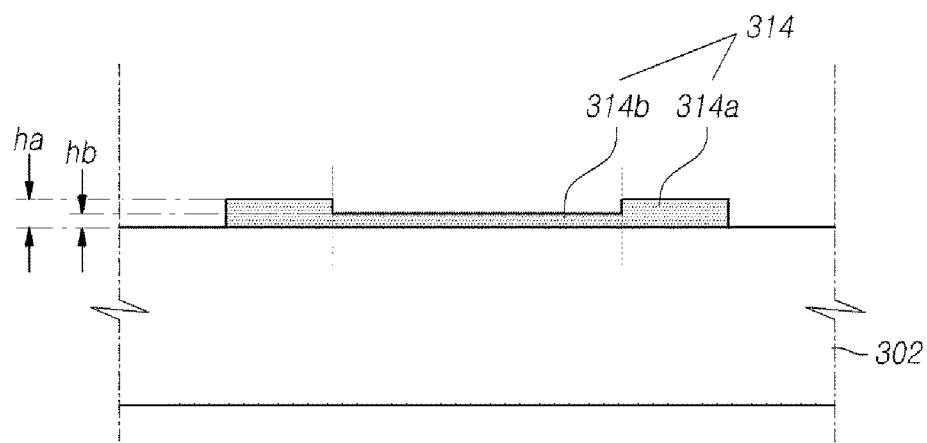

Referring to FIGS. 7E and 7F, the photoresist layer 730 is deleted to a predetermined height through an ashing process with an ashing gas, then the material for the first electrode is exposed and there is completed the first electrode 314 of FIG. 1 with the different thicknesses ($h_a > h_b$) by controlling an etching ratio of a wet etching or a dry etching and deleting some of the photoresist layer 730.

Figure 7G:
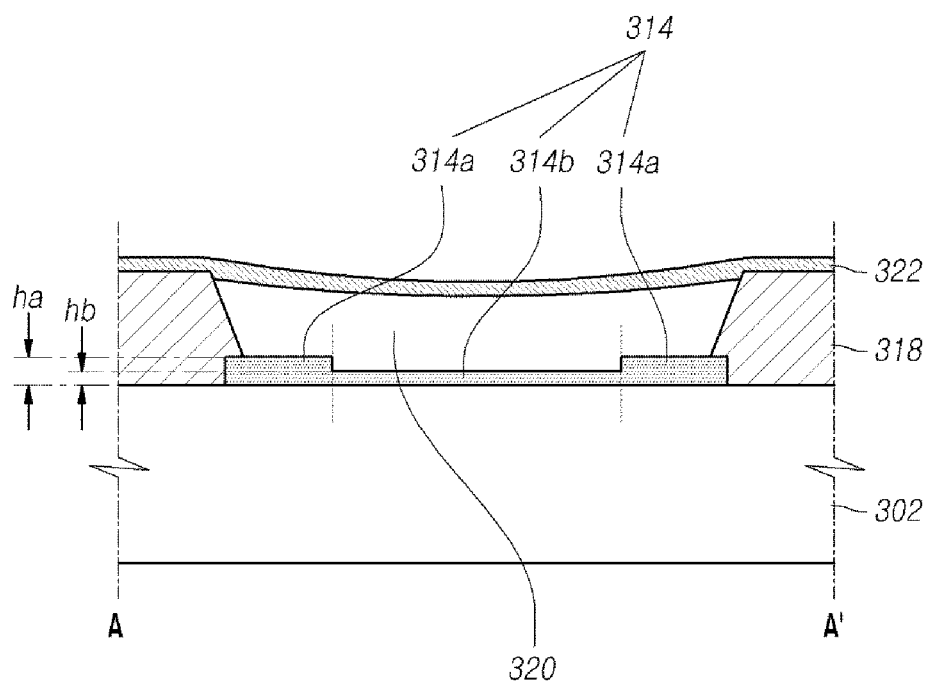

Referring to FIG. 7G, after completing the bank 318, the organic layer 320 and the second electrode 322 is sequentially formed so that the organic light emitting device of FIG. 3 is completed. The organic layer may be formed by material for the soluble process, but is not limited thereto.

FIGS. 8A to 8G are sectional views illustrating the method for fabricating the organic light device in FIG. 3 according to another embodiment.

Referring to FIGS. 8A to 8G, the first electrode 314 may be formed by method for fabricating different from that of FIGS. 7A to 7G.

Figure 8A:
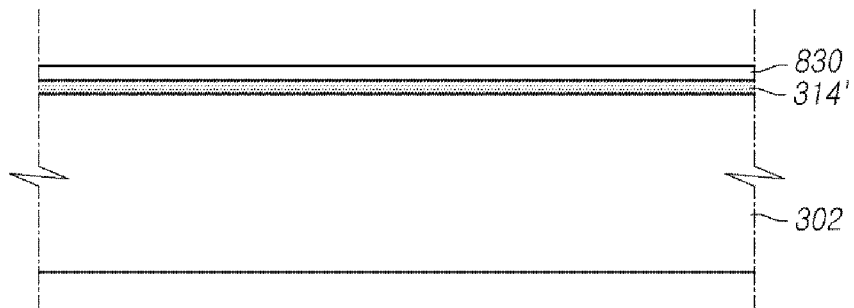
FIGS. 8A to 8G are sectional views illustrating the method for fabricating the organic light device in FIG. 3 according to another embodiment.
Figure 8B:
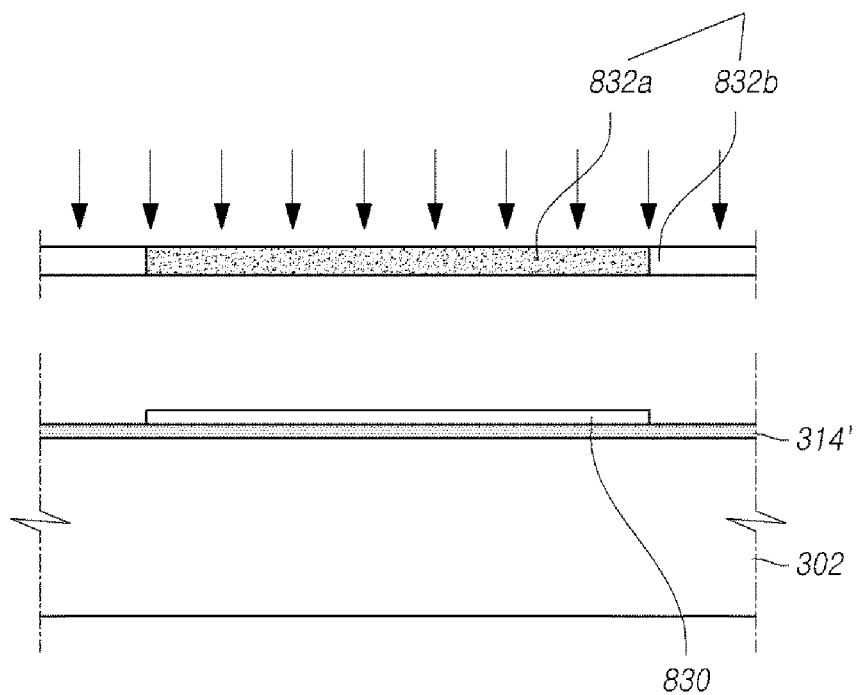
Figure 8C:
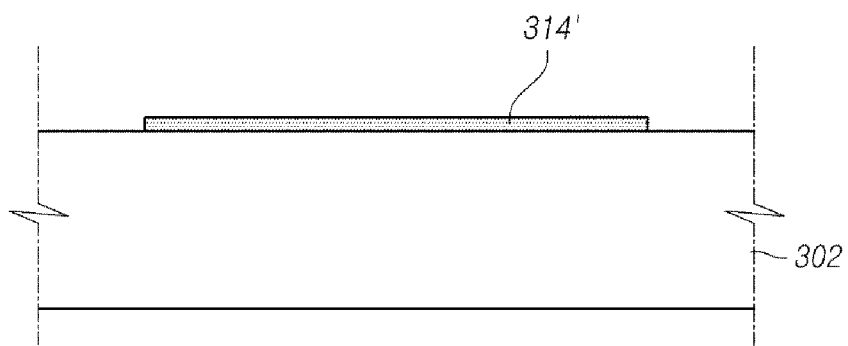
Figure 8D:
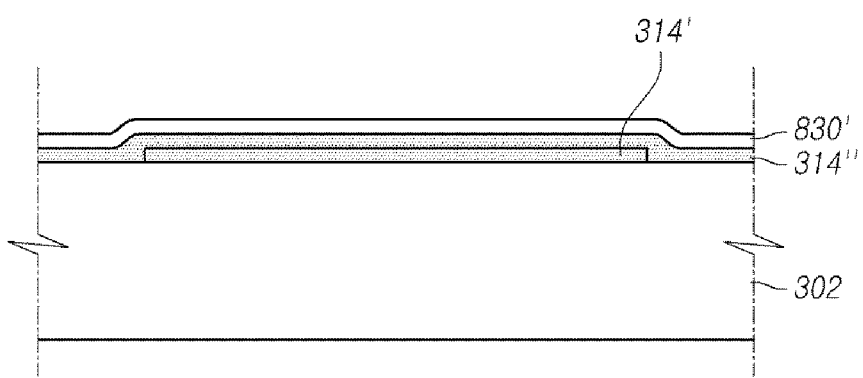
Figure 8E:
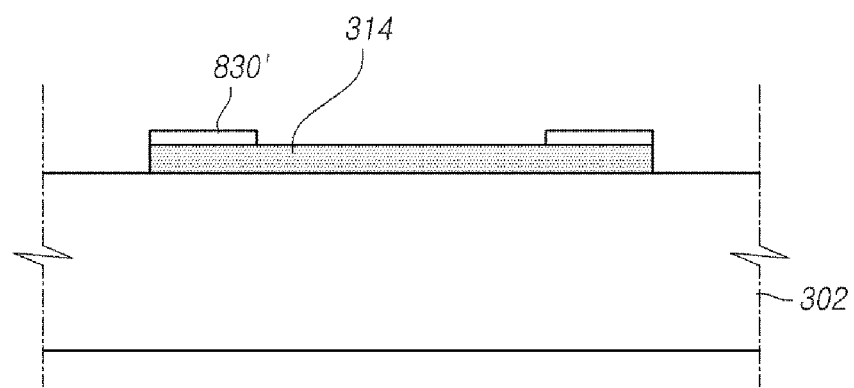
Figure 8F:
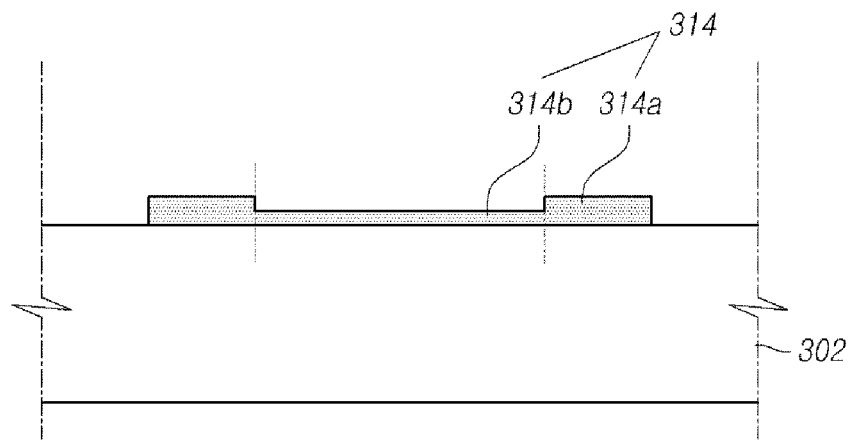

Referring to FIG. 8A, material 314' for the first electrode which has the same height $h_b$ of the first electrode 314 of FIG. 3 and material for the photoresist layer 830 is sequentially coated and then the surface thereof is exposed through the mask 832. The photoresist layer 830 corresponding to the light shield layer 832a of the mask 832 keeps the predetermined height and the photoresist layer 830 corresponding to the transparent area 832b is completely deleted. The material 314' for the first electrode is then formed by performing a wet/dry etching process and a strip process.

Figure 8G:
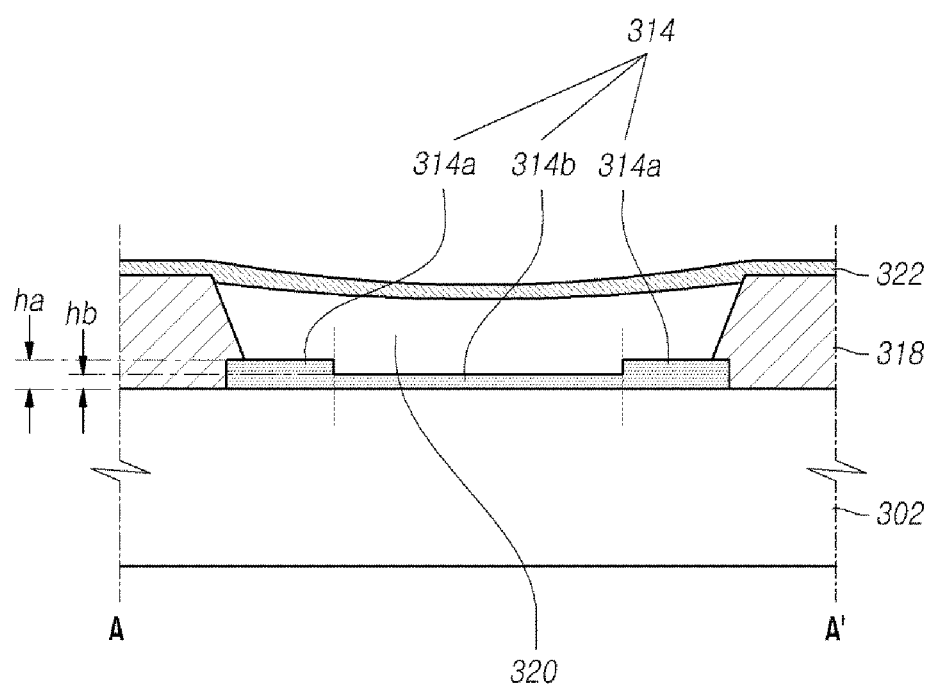

Referring to FIGS. 8A to 8F, after the material 314' the first electrode with the predetermined height ($h_a-h_b$) and the photoresist layer 831' is sequentially laminated and the photoresist layer 831' is patterned using the mask 832, material 314" for the first electrode is deleted through a wet etching or a dry etching so that the patterned first electrode 314 is formed. Referring to FIG. 8G, the bank 318 is formed and then the organic layer 320 and the second electrode 322 are sequentially formed.

Although FIGS. 8A to 8G illustrates the case to use the first electrode 314 with the non-constant thickness consisting of the same material, but various embodiments is not limited thereto and the first electrode 314 is formed by the multilayer consisting of the different materials.

FIGS. 9A to 9G are sectional views illustrating the method for fabricating the organic light device in FIG. 5 according to further another embodiment.

Referring to FIGS. 9A to 9G, the first electrode 514 may be formed by sequentially coating a lot of material 514' and 514" for the first electrodes on the substrate 502 and then the photoresist layer 930 is formed by coating material for the photoresist layer on the first electrode 514.

Figure 9A:
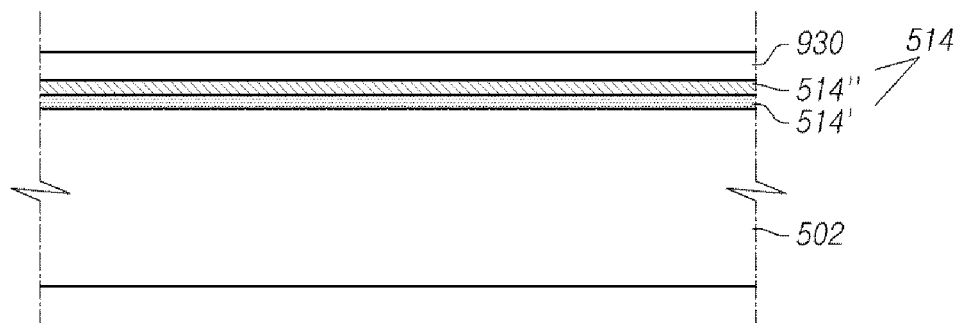
FIGS. 9A to 9G are sectional views illustrating the method for fabricating the organic light device in FIG. 5 according to further another embodiment.
Figure 9B:
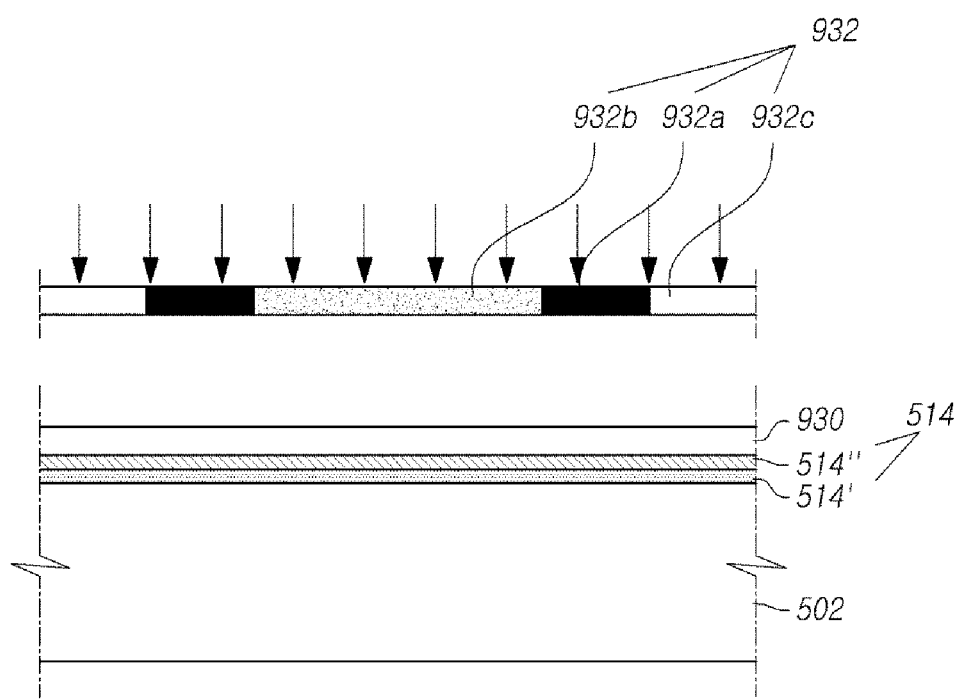
Figure 9C:
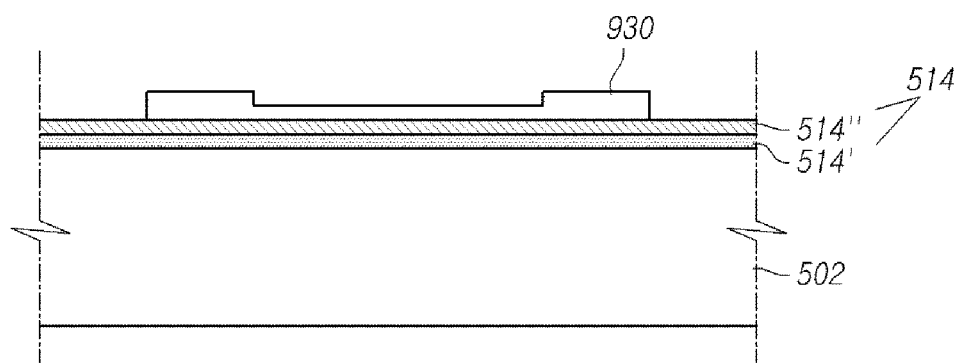
Figure 9D:
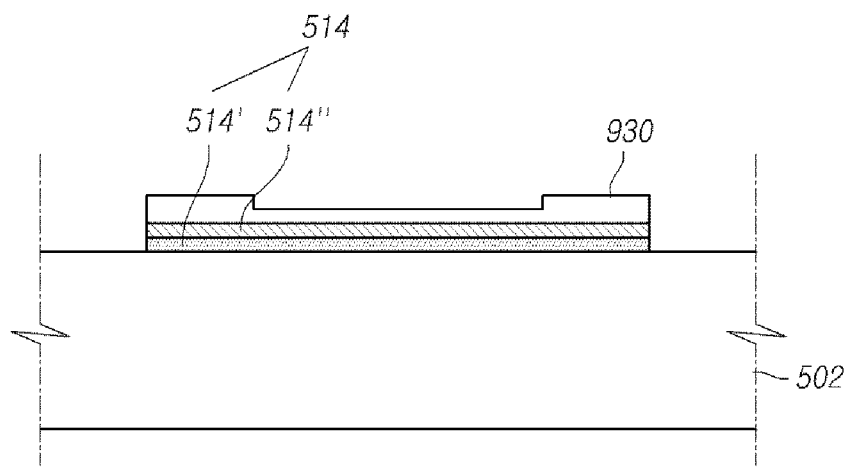
Figure 9E:
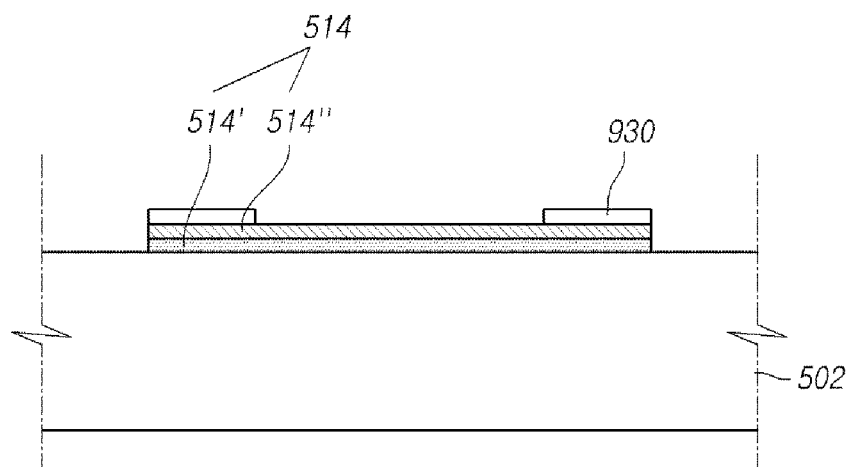

Referring to FIG. 9A, the halftone mask 932 including a light shield area 932a, a light semi-transmission area 932b and a transparent area 932c is aligned to the precise aligned position and then there is performed the exposure process in which light is emitted from the light source to the halftone mask 932 and a pattern of the halftone mask 932 is transferred to the substrate. The exposed photoresist layer 930 is patterned by performing a process to develop the material for the exposed photoresist layer. As a result of the patterning, an area of the photoresist layer 930 corresponding to the transparent area 932c of the halftone mask 932 is completely deleted, an area of the material for the photoresist layer 930 corresponding to the semitransmission area 932b of the halftone mask 932 has the original height and an area of the material for the photoresist layer 930 corresponding to the light shield area 932a of the halftone mask 932 has the height some of which is got rid of.

Figure 9F:
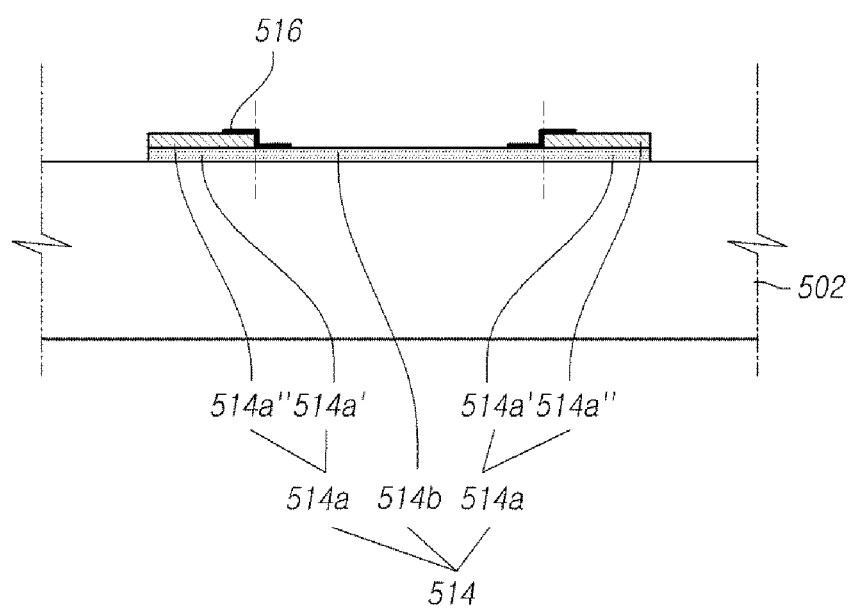
Figure 9G:
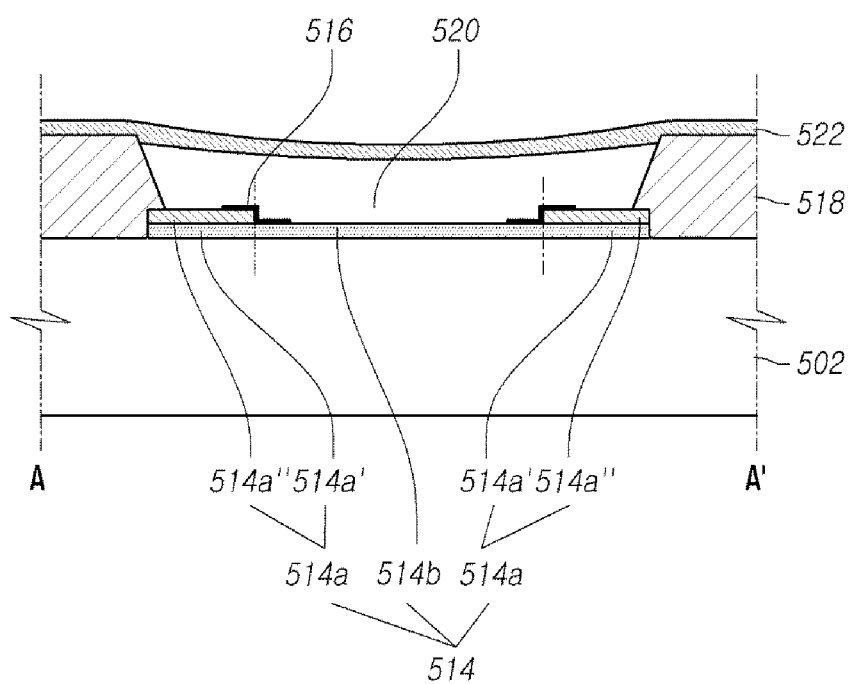

Referring to FIGS. 9A to 9E, material for the first electrode 514 not covered with the photoresist layer 930 is deleted through a wet etching or a dry etching process. The photoresist layer 930 is deleted to a predetermined height through an ashing process, then the first electrode is exposed and the first electrode 514 of FIG. 5 the first area 514a of which consists of a multilayer is formed by controlling an etching ratio of a wet etching or a dry etching and deleting some of the photoresist layer 930. Referring to FIG. 9F, the first insulating layer 516 may be formed at a step portion of the first electrode 514.

After then, the bank 318 is formed and then, the organic layer 320 and the second electrode 322 are sequentially laminated.

Although FIGS. 9A to 9G illustrates the case to use the first electrode 514 the first area 514a of which consists of two layers 514a' and 514a" including the different materials 514' and 514" respectively, but various embodiments is not limited thereto and the first electrode 314 is formed by either including much more layers or consisting of the same materials.

FIGS. 10A to 10G are sectional views illustrating the method for fabricating the organic light device in FIG. 5 according to another embodiment.

Figure 10A:
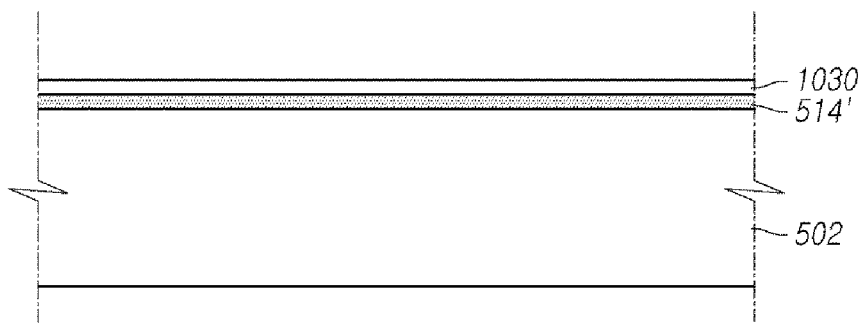
FIGS. 10A to 10G are sectional views illustrating the method for fabricating the organic light device in FIG. 5 according to another embodiment.
Figure 10B:
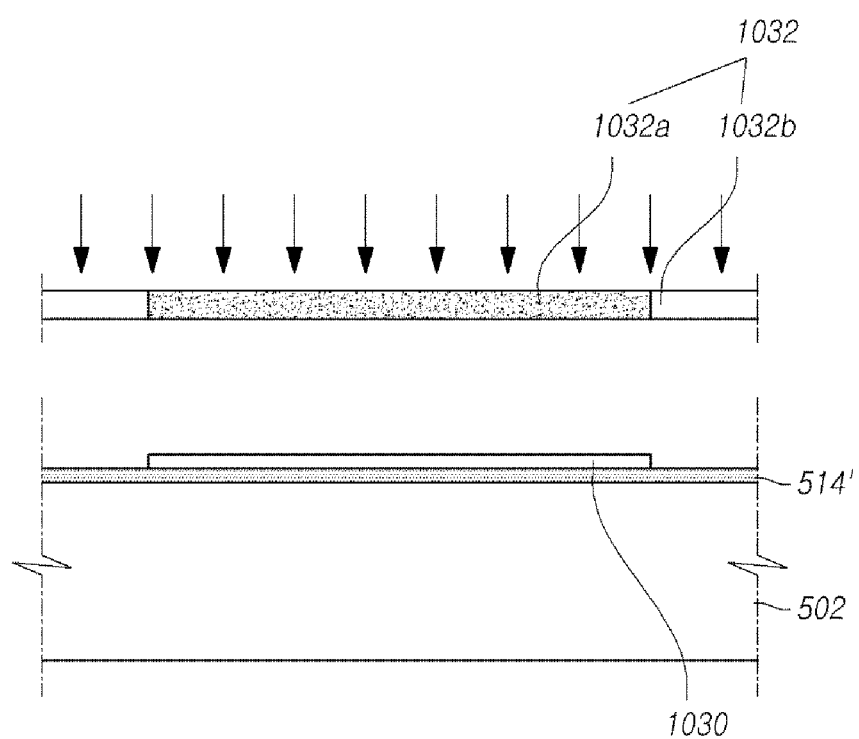
Figure 10C:
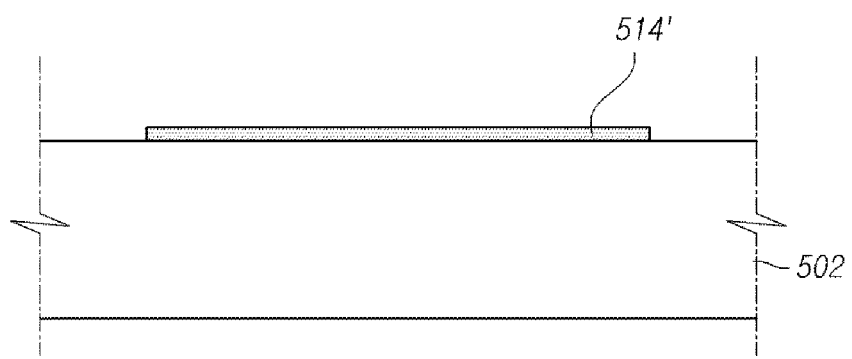
Figure 10D:
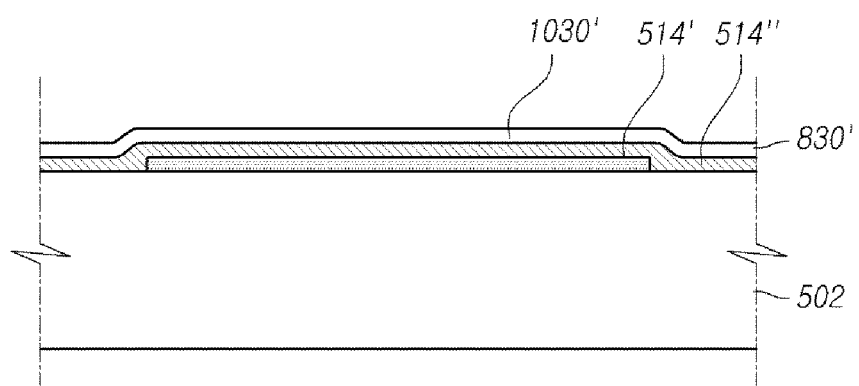
Figure 10E:
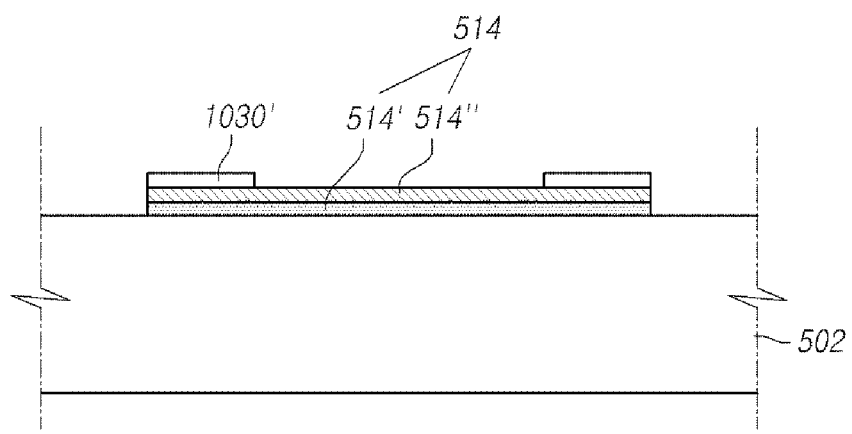

Referring to FIG. 10A, one material 514' of the first electrode and material for the photoresist layer 1030 is sequentially coated and then the surface thereof is exposed through the mask 1032. The material for the photoresist layer 1030 corresponding to the light shield layer 1032a of the mask 1032 keeps the predetermined height and the material for the photoresist layer 1030 corresponding to the transparent area 1032b is completely deleted. The first electrode 514' is then formed by performing a wet/dry etching process and a strip process.

Referring to FIGS. 10B to 10E, after the other material 514" of the first electrode and material for the photoresist layer 1031' is sequentially laminated and the photoresist layer 1014' is patterned using the mask, the other 514" of the first electrode is deleted through a wet etching or a dry etching so that the patterned first electrode 514 is formed.

Figure 10F:
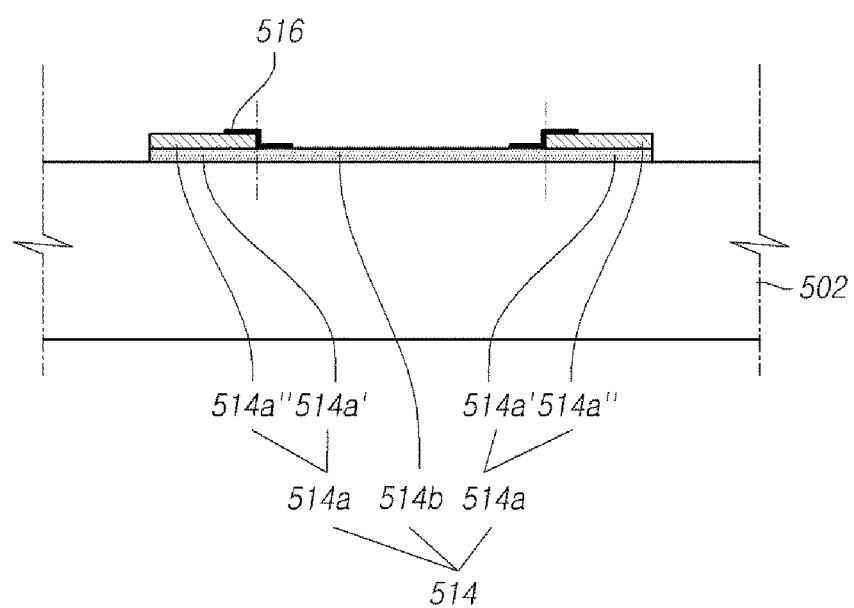
Figure 10G:
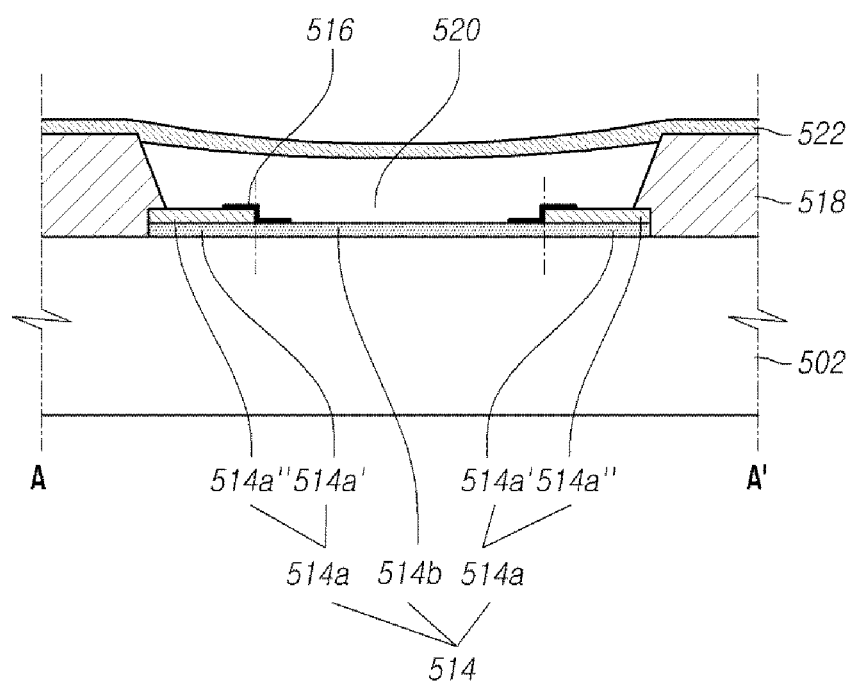

Referring to FIG. 10F, the first insulating layer 516 may be formed at a step portion of the first electrode 514. Referring to FIG. 10G, the bank 518 is formed and then the organic layer 520 and the second electrode 522 are sequentially formed.

Hereafter, another embodiment including the first electrode with a predetermined height and a plurality of layers will be described below.

Figure 11:
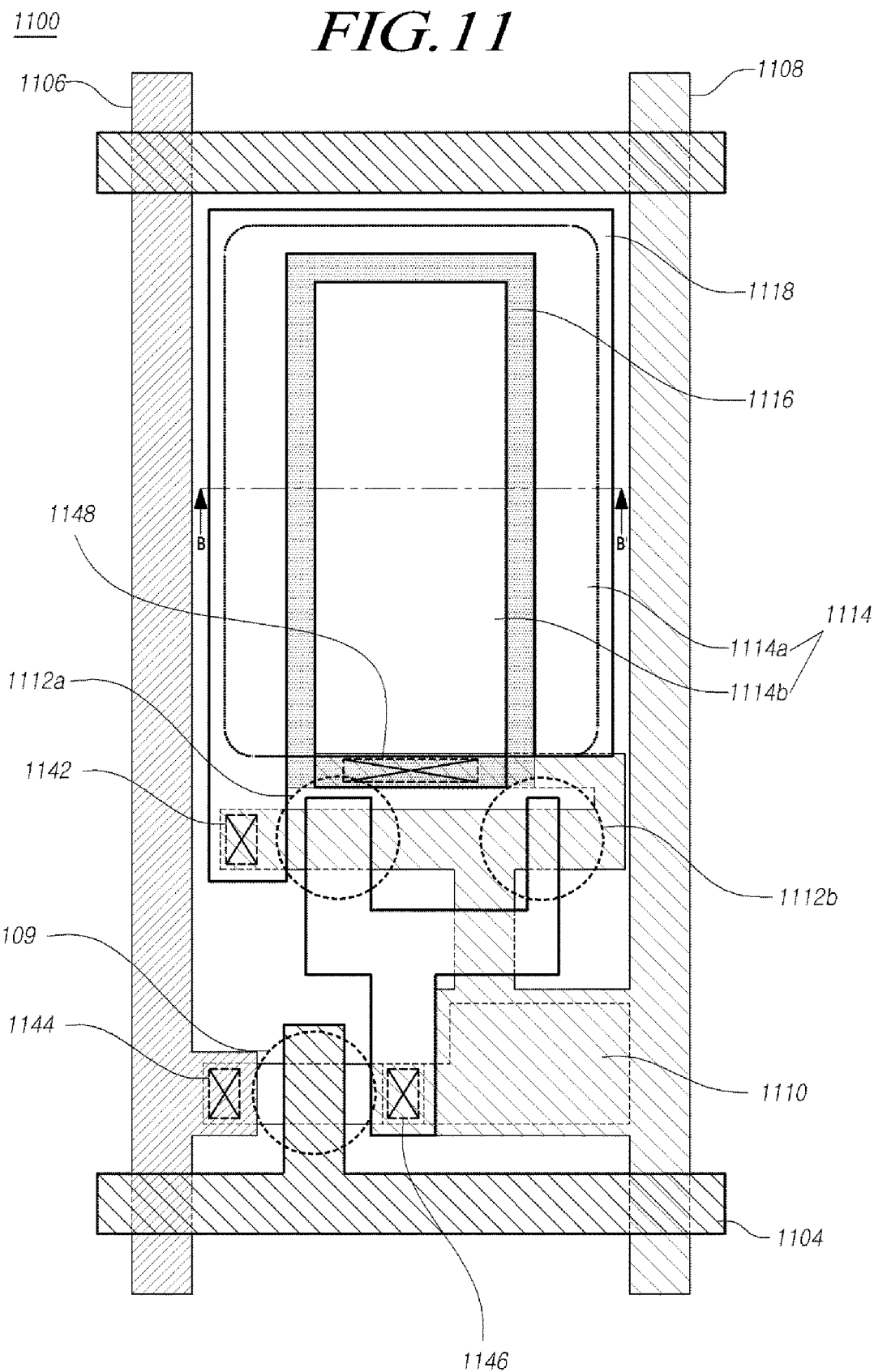
FIG. 11 is a planar view schematically illustrating an organic light emitting device according to further another embodiment.
Figure 12:
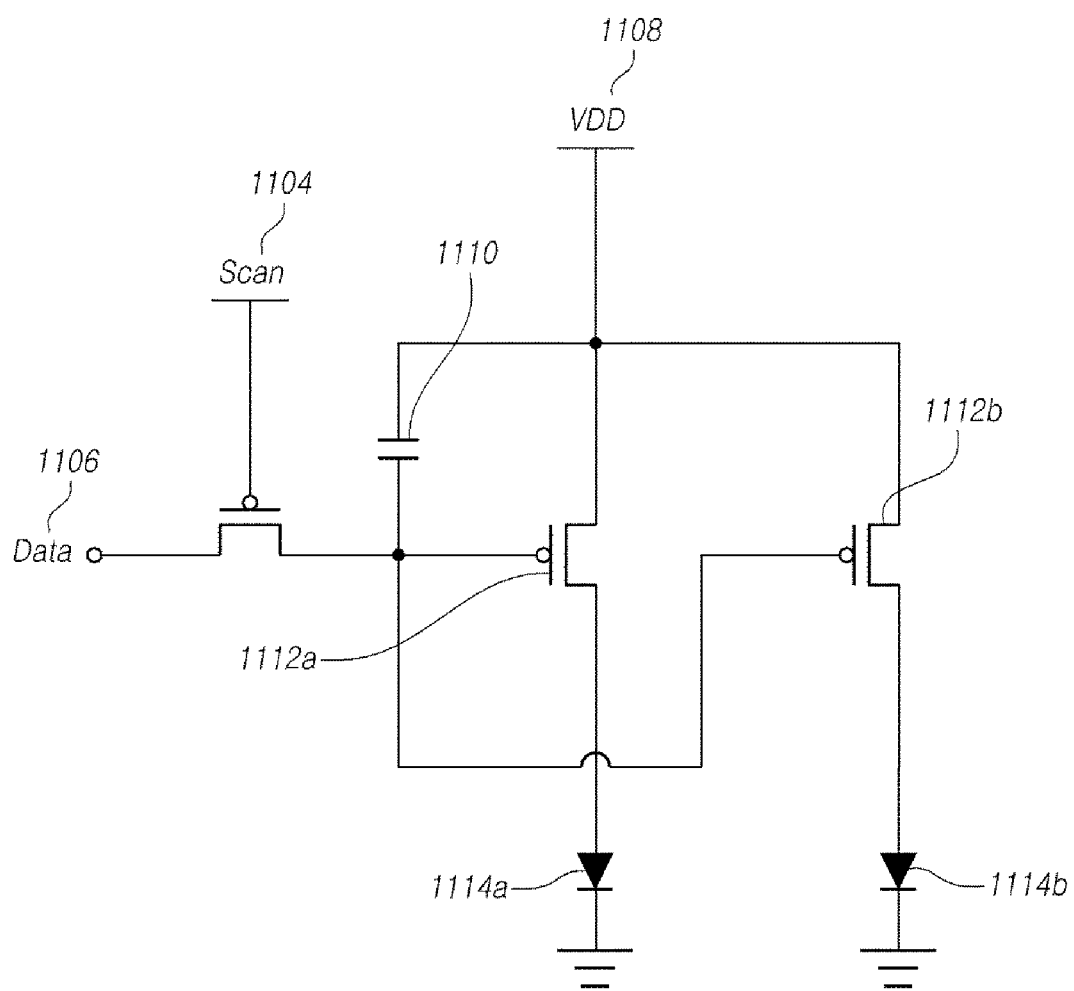
FIG. 12 is a circuit diagram of FIG. 11.

FIG. 11 is a planar view schematically illustrating an organic light emitting device according to further another embodiment. FIG. 12 is a circuit diagram of FIG. 11.

Referring to FIGS. 11 and 12, an organic light emitting device 1100 may include the substrate 1102 formed on two driving transistors 1112a and 1112b, a bank or a pixel defining layer 1118 which is formed on the substrate 1102 and defines the boundary of a pixel region, a first electrode 1114 formed on the substrate 1102 and electrically connected with the two driving transistors 1112a and 1112b wherein the quantity of a current flowing through a first area 1114a adjacent to the bank 1118 is larger than that through a second area 1114b, an organic layer (not shown) formed on the substrate 1102 corresponding to the pixel region and a second electrode (not shown) formed on the organic layer. An edge of the first electrode 1114 is partially overlapped with the bank 1118.

The first electrode 1114 may include a first area electrode 1114a and a second area electrode 1114b separated from the first area electrode 1114a. The second insulating layer 1116 may be further included between the first area electrode 1114a and the second area electrode 1114b.

As shown, the first area electrode 1114a may be in shape of a "u" (e.g., ⊓) and the second area electrode 1114b may be in shape of rectangular, both in a direction parallel to the substrate (e.g., in a direction perpendicular to the first and second cross sectional areas of the first electrode). Therefore, the first area electrode 1114a may be in shape of enclosing the second area electrode 1114b.

Meanwhile, the driving transistor 1112 may comprise a first driving transistor 1112a electrically connected with the first area electrode 1114a and a second driving transistor 1112b electrically connected with the second area electrode 1114b, and a current drivability of the first driving transistor 1112a is larger than that of the second driving transistor 1112b.

The value of a channel width/a channel length of the first driving transistor may be larger than that of the second driving transistor, or an electron mobility of an active layer of the first driving transistor may be higher than that of the second transistor.

Generally the current drivability of the driving transistor is proportional to the channel width, namely the width of the active layer or the semiconductor layer, and is inversely proportional to the channel length. As shown, the organic light emitting device according to further another embodiment is that the channel length of the first driving transistor 1112a is larger than that of the second driving transistor 1112b so that the current drivability of the former 1112a can be larger than that of the latter 1112b. Therefore, when the organic light emitting device 1110 is turned on, the quantity of the current flowing to the first area electrode 1114a driven by the first driving transistor 1112a may become larger than that of the second area electrode 1114b driven by the second driving transistor 1112b, thereby maintaining the light emitting uniformity.

Meanwhile the second insulating layer 1116 may be formed of an inorganic insulation material such as silicon nitride (SiNx) and silicon oxide (SiOx), SiON, Al2O3, TiO2, Ta2O5, HfO2, ZrO2, BST, PZT, an organic insulation material such as benzocyclobutene or acrylic resin, or a combination thereof, but is not limited thereto.

The organic light emitting device 1100 may comprise a plurality of electric lines. The plurality of electric lines comprise a scan line extending in one direction, namely vertical direction in FIG. 11, and transmitting a scan signal or a gate signal respectively, a data line extending in the other direction, namely horizontal direction in FIG. 11 and transmitting a data signal respectively, and a power line (hereafter, is referred as a "VDD line") supplying a high voltage power. The VDD line is separated with the scan line in parallel. The scan line 1104 is extended to a gate pad (not shown) in the vertical direction and the data line 1106 is extended to a data pad (now shown) in the horizontal direction in FIG. 11.

The data line 1106 and the VDD line 1108 may be formed with a monolayer or multiple layers of at least one metal or alloy of Al, Pt, Pd, Ag, Mg, Au, Ni, Nd, Ir, Cr, Li, Ca, Mo, Ti, W and Cu, ALND, MoTi and the like.

The organic light emitting device 1100 may include the electrodes 1114 and the organic layer at a pixel area which is defined at each of intersection between the scan line 1104 and the data line 1106, and emit a light in accordance with a current supplied from the transistors 1109, 1112a and 1112b formed on the substrate 1102.

The first area electrode 1114a is connected to one end of the driving transistor 1112a through a first contact hole 1142, the other end of the driving transistor 1112a is connected to the VDD line 1108, and the VDD line 1108 is connected to a storage capacitor 1110. The second area electrode 1114b is connected to one end of the driving transistor 1112b through a fourth contact hole 1148. The storage capacitor 1110 is connected to one end of a switching transistor 1109 through a third contact hole 1146 and the other end of the switching transistor 1109 is connected to the data line 1106 through a second contact hole 1144. The scan line 1104 is connected to a gate of the switching transistor 1109.

In view of electrical function of the organic light emitting device 1100, the switching transistor 1109 is turned on by the scan signal supplied through the scan line 1104 so that the data signal supplied through the data line 1106 is transmitted to the gate electrode of the two driving transistors 1112a and 1112b. The storage capacitor 1110 may store the data signal supplied through the switching transistor 1109 and maintain the turn-on state during the predetermined time. The two driving transistor 1112a and 1112b are driven in response to the data signal stored to the storage capacitor 1110. The two driving transistors 1112a and 1112b may control the driving current or voltage supplied to the first area electrode 1114a and the second area electrode 1114b in response to the data signal.

If the two driving transistors 1112a and 1112b are driven, an emitting layer of the organic layer may emit the light by the current supplied through the VDD line 1108. When the driving currents supplied through the two driving transistors 1112a and 1112b are transmitted to the first area electrode 1114a and the second area electrode 1114b respectively, and flow through the organic layer to the second electrode, an electron and a hole is recombined in the organic layer so as to emit the light.

Figure 13:
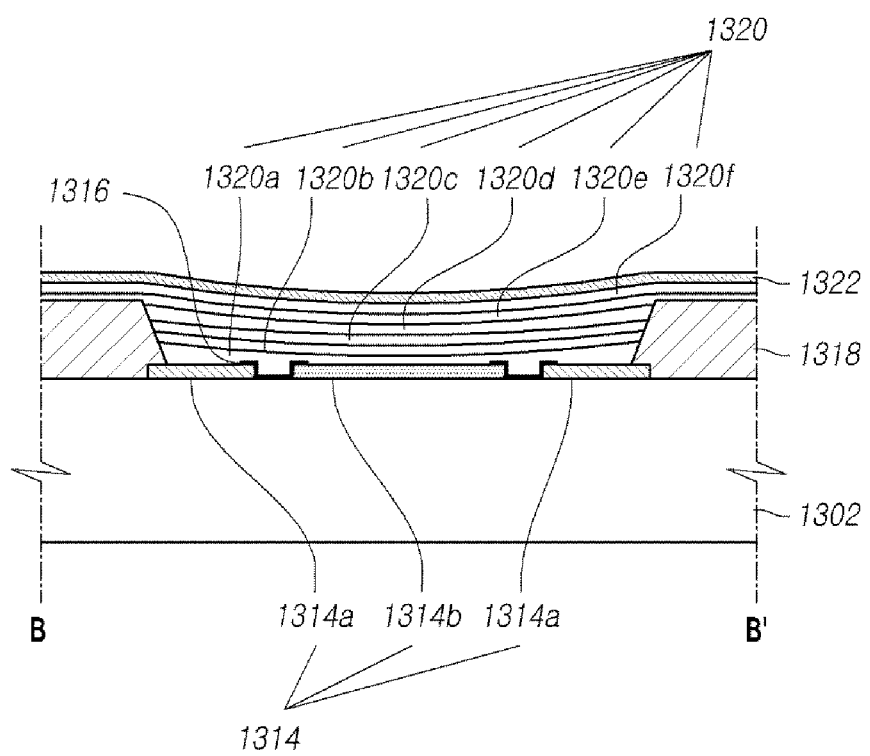
FIG. 13 is a sectional view illustrating one example of an organic light emitting device, which is taken alone a line B-B' in FIG. 11, according to further another embodiment.

FIG. 13 is a sectional view illustrating one example of an organic light emitting device, which is taken alone a line B-B' in FIG. 11, according to further another embodiment.

Referring to FIG. 13, a first electrode 1314 is formed on a substrate 1302 and there is formed a bank 1318 which defines the pixel region. An edge of the first electrode 1314 is partially overlapped with the bank 1318. The first electrode 1314 is exposed through the open region of the bank 1318 and an organic layer 1320 is formed on the first electrode 1314. The second electrode 1322 is formed in order to cover the bank 318 and the organic layer 1320.

The first electrode 1314 may be divided a first area electrode 1314a adjacent to the bank 1318 and a second area electrode 1314b not adjacent to the bank 1318. The second insulating layer 1116 may be further included between the first area electrode 1314a and the second area electrode 1314b in order to prevent the degradation by a concentration of a charge. The first area electrode 1314a and the second area electrode 1314b consists of at least one of ITO, FTO, ATO, AZO, IZO and the like. The first area electrode 1314a and the second area electrode 1314b may be either the same material or the different material.

The first area electrode 1314a is electrically connected to the first driving transistor 1112a and the second area electrode 1314b is electrically connected to the second driving transistor 1112b.

Because the current drivability of the first driving transistor 1112a is larger than that of the second driving transistor 1112b, when the organic light emitting device 1110 is turned on, the quantity of the current flowing to the first area electrode 1114a driven by the first driving transistor 1112a may become larger than that of the second area electrode 1114b driven by the second driving transistor 1112b, thereby preventing the light emitting uniformity.

The bank 1318 is in shape of eclipse. The bank 1318 may be formed of an inorganic insulation material, an organic insulation material or a combination thereof, but is not limited thereto.

The organic layer 1320 is formed inside a boundary of the bank 1318 on the first electrode 1314. The organic layer 1320 may include, not limited thereto, a hole injection layer 1320a, a hole transfer layer 1320b, an emitting supplemental layer 1320c, an emitting layer 1320d, an electron transfer layer 1320e, an electron injection layer 1320f, and the like which are sequentially laminated, but is not limited thereto.

The hole injection layer 1320a, the hole transfer layer 1320b, the emitting supplemental layer 1320c and the emitting layer 1320d may be formed by a soluble process such as an inkjet printing, a roll to roll printing, a screen printing, a spray coating, a dip spin coating, a blade coating, a roll-slit coating and the like, but not limited thereto. And the electron transfer layer 1320e and the electron injection layer 1320f may be formed on all surface of the substrate, but is not limited thereto. The organic layer 1320 is formed by a soluble process, an upper surface of the organic layer 1320 may be formed in curved surface. That is, a thickness of the organic layer 1320 in the first area adjacent to the bank 1318 is larger than a thickness thereof in the second area not adjacent to the bank 13181.

Figure 14:
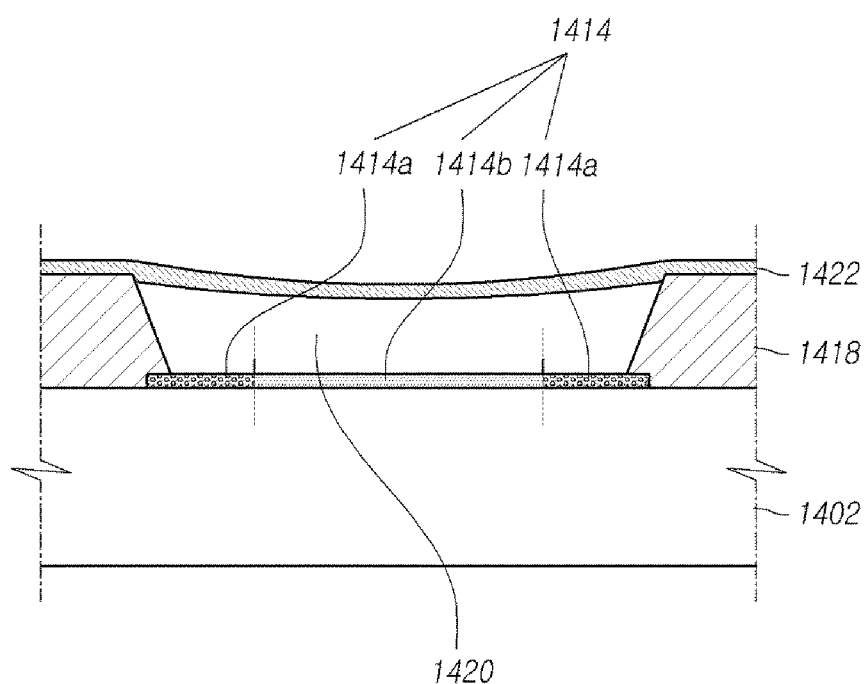
FIG. 14 is a sectional view illustrating an organic light emitting device according to further another embodiment.

FIG. 14 is a sectional view illustrating an organic light emitting device according to further another embodiment.

Referring to FIG. 14, a first electrode 1414 and a bank 1418 are formed on a substrate 1402. The organic layer 1420 is formed on the first electrode 1414. The second electrode 1422 is formed in order to cover the bank 318 and the organic layer 1420. The first electrode 1414 may consist of two or more areas different from each other one of which is surrounded by the other. A specific resistance of the surrounding area is different from that of the surrounded area in the first electrode. A specific resistance of the surrounding area such as the first area 1414a may be lower than one of the surrounded area such as the second area 1414b. Although the first electrode is divided into the first area 1414a and the second area 1414*b* in the organic light emitting device of FIG. 4, it may be divided into two or more areas.

Unlike the first electrode of the above-described embodiments with the different thickness or separated with each other, the first electrode 1414 is integrally formed with the same thickness. The first electrode 1414 may consist of at least one of ITO, FTO, ATO, AZO, IZO and the like, but it is not limited thereto.

The first electrode 1414 may be divided a first area 1414*a* adjacent to the bank 1418 and a second area 1414*b* not adjacent to the bank 1418. The first area 1414*a* of the first electrode 1414 has low specific resistance by being performed by hydrogen plasma. In order words, a specific resistance of the first area 1414*a* is lower than that of the second area 1414*b* in the first electrode 1414. Therefore the quantity of a current flowing through a first area 1414*a* adjacent to the bank 1418 is larger than that through a second area 1414*b*.

In order to perform the hydrogen plasma process, the first electrode is formed, then a photoresist is coated at the second area 1414*b*, then the hydrogen plasma is performed on the first area not coated with the photoresist and then the photoresist is finally peeled, thereby inducing the same effect as the first electrode with the different thicknesses or separated with each other.

The organic light emitting device 200 and 1100 according to various embodiments may solve the problem that because the thickness of the organic layer formed by a solution process is not flat, the hole is not smoothly transferred to the thicker area of the organic layer, thereby degrading the light emitting uniformity and changing a recombination zone forming exitons.

According to various embodiments, one of forming the first electrode in which the thicknesses of the area adjacent to a bank is larger than that of the area not adjacent to the bank, dividing the first electrode into two area electrodes which is electrically connected to a plurality of transistors with the different current disabilities respectively and performing the area adjacent to the bank in the first electrode by plasma, enables the first area adjacent to the bank to flow the current much more, thereby preventing degradation of the light emitting uniformity. Therefore it can improve the light emitting efficiency and elongate the lifetime for the organic light emitting device.

In addition, in case the first area of the first electrode is formed of a multilayer of ITO-IZO, the transmittance in the visible region is improved and the surface resistance is more lowered so that the effect of improving hole injection can also be obtained.

Although various embodiments have been described up to now with reference to the accompanying drawings, the present invention is not limited to thereto.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. A term ordinarily used like that defined by a dictionary shall be construed that it has a meaning equal to that in the context of a related description, and shall not be construed in an ideal or excessively formal meaning unless it is clearly defined in the present specification.

Although the embodiments of the present invention have been described for illustrative purposes, those skilled in the art will appreciate that various modifications, additions and substitutions are possible, without departing from the scope and spirit of the invention. Therefore, the embodiments disclosed in the present invention are intended to illustrate the scope of the technical idea of the present invention, and the scope of the present invention is not limited by the embodiment. The scope of the present invention shall be construed on the basis of the accompanying claims in such a manner that all of the technical ideas included within the scope equivalent to the claims belong to the present invention.

What is claimed is:

1. An organic light emitting device, comprising:
    a substrate on which a driving transistor is formed;
    a bank formed on the substrate providing a boundary for a pixel region;
    a first electrode located on the substrate and electrically connected with the driving transistor, the first electrode comprising a first and a second cross sectional area both oriented in a direction substantially perpendicular to a first direction of the substrate, the first area adjacent to the bank, the second area surrounded by the first area, the first area of the first electrode comprising a specific resistance that is lower than that of the second area of the first electrode;
    an organic layer located on the first electrode within the boundary provided by the bank, at least a portion of the organic layer formed to physically contact the first electrode over the first area; and
    a second electrode located on the organic layer, wherein the organic layer comprises a hole injection layer and an emitting layer and the hole injection layer is disposed on the first and the second area of the first electrode.

2. The organic light emitting device as claimed in claim 1, wherein the organic layer comprises a concave shape along a surface bordering the second electrode, the organic layer thinner adjacent to where the second area of the first electrode is formed.

3. The organic light emitting device as claimed in claim 1, wherein the second area does not physically contact the bank.

4. The organic light emitting device as claimed in claim 1, wherein the pixel region is located within the boundary defined by the bank, and wherein the boundary is located above the first area.

5. The organic light emitting device as claimed in claim 1, wherein the bank is in a forward tapered shape.

6. The organic light emitting device as claimed in claim 1, wherein the first cross section area is larger than the second cross sectional area.

7. The organic light emitting device as claimed in claim 1, wherein the first insulting layer comprises at least one from the group consisting of $SiO_x$, $SiN_x$, $SiON$, $Al_2O_3$, $TiO_2$, $Ta_2O_5$, $HfO_2$, $ZrO_2$, BST, PZT, benzocyclobutene, and an acryl based resin.

* * * * *